United States Patent
Segi

(10) Patent No.: US 10,985,012 B2
(45) Date of Patent: Apr. 20, 2021

(54) SEMICONDUCTOR DEVICE AND METHOD OF MANUFACTURING THE SAME

(71) Applicant: RENESAS ELECTRONICS CORPORATION, Tokyo (JP)

(72) Inventor: Kazuhiko Segi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 1 day.

(21) Appl. No.: 16/406,929

(22) Filed: May 8, 2019

(65) Prior Publication Data

US 2019/0371593 A1 Dec. 5, 2019

(30) Foreign Application Priority Data

May 30, 2018 (JP) .............................. JP2018-103542

(51) Int. Cl.
| | |
|---|---|
| *H01L 21/02* | (2006.01) |
| *H01L 21/266* | (2006.01) |
| *H01L 21/265* | (2006.01) |
| *H01L 21/28* | (2006.01) |
| *H01L 29/51* | (2006.01) |

(52) U.S. Cl.
CPC ........ *H01L 21/022* (2013.01); *H01L 21/0217* (2013.01); *H01L 21/0228* (2013.01); *H01L 21/02164* (2013.01); *H01L 21/266* (2013.01); *H01L 21/26506* (2013.01); *H01L 21/28194* (2013.01); *H01L 29/517* (2013.01)

(58) Field of Classification Search
None
See application file for complete search history.

(56) References Cited

U.S. PATENT DOCUMENTS 7,125,805 B2    10/2006 Chen et al.
2005/0112817 A1* 5/2005 Cheng ................. H01L 29/6656
                                                          438/219

FOREIGN PATENT DOCUMENTS

JP    2007-536734 A    12/2007
JP    2010-171086 A    8/2010

* cited by examiner

*Primary Examiner* — Robert K Carpenter
(74) *Attorney, Agent, or Firm* — McDermott Will & Emery LLP

(57) ABSTRACT

First, an offset spacer including a stacked film of insulating films is formed on the upper surface of the semiconductor layer, the side surface of the gate electrode, and the side surface of the cap film. Next, a part of the insulating films is removed to expose the upper surface of the semiconductor layer. Next, in a state where the side surface of the gate electrode is covered with the insulating films, an epitaxial layer is formed on the exposed upper surface of the semiconductor layer. Here, among the offset spacers, the insulating film which is a silicon nitride film is formed at a position closest to the gate electrode, and the position of the upper end of the insulating film formed on the side surface of the gate electrode is higher than the position of the upper surface of the gate electrode.

16 Claims, 12 Drawing Sheets

SEMICONDUCTOR DEVICE AND METHOD OF MANUFACTURING THE SAME

CROSS-REFERENCE TO RELATED APPLICATIONS

The disclosure of Japanese Patent Application No. 2018-103542 filed on May 30, 2018 including the specification, drawings and abstract is incorporated herein by reference in its entirety.

BACKGROUND

The present invention relates to a semiconductor device and a manufacturing method thereof, and, for example, to a technique effective for application to a semiconductor device using an SOI substrate.

As a semiconductor device for low power consumption, there is a technique of forming a MISFET (Metal Insulator Semiconductor Field Effect Transistor on an SOI (Silicon On Insulator) substrate having a semiconductor substrate, an insulating layer formed on the semiconductor substrate, and a silicon layer formed on the insulating layer. In order to adjust the width of the extension region when an impurity region such as an extension region is formed in the silicon layer of the SOI substrate, there is a technique of forming an insulating film called an offset spacer on the side wall of the gate electrode.

Japanese Patent Application Publication No. 2010-171086 discloses a technique in which a silicon nitride film is formed as a first-layer offset spacer and a silicon oxide film is formed as a second-layer offset spacer on a side wall of a gate electrode.

Japanese Patent Application Publication No. 2007-536734 discloses a technique in which a silicon oxide film is formed as a first-layer offset spacer on a sidewall of a gate electrode on an SOI substrate, a silicon nitride film is formed as a second-layer offset spacer, a silicon oxide film is formed as a third-layer offset spacer, and then an epitaxial layer is formed on a semiconductor layer.

SUMMARY

For example, when an epitaxial layer is formed on a silicon layer as described in Japanese Patent Application Publication No. 2007-536734, if a gate electrode including a semiconductor layer is exposed, the epitaxial layer may grow abnormally from the gate electrode. In such cases, there is a concern that the MISFET characteristics may fluctuate or leak with plugs connected to the epitaxial layers.

Other objects and novel features will become apparent from the description of this specification and the accompanying drawings.

The typical ones of the embodiments disclosed in the present application will be briefly described as follows.

The method of manufacturing a semiconductor device according to an embodiment includes the steps of: (a) forming a gate electrode and a cap film on a first semiconductor layer, the gate electrode having a second semiconductor layer, and the cap film being formed on the gate electrode; and (b) forming an offset spacer comprised of a laminated film on each of an upper surface of the first semiconductor layer, a side surface of the gate electrode and a side surface of the cap film, the laminated film being comprised of three or more layers including a first silicon nitride film and a first silicon oxide film. The method further includes the steps of: (c) exposing the upper surface of the first semiconductor layer by removing a part of the offset spacer; and (d) after the step (c), forming a third semiconductor layer on the upper surface of the first semiconductor layer, which is exposed from the offset spacer, by epitaxial growth method, in a state that an upper surface of the gate electrode is covered with the cap film, and that the side surface of the gate electrode is covered with the offset spacer. Here, a film of the laminated film, which is closest to the gate electrode in the laminated film, is the first silicon nitride film. Also, in the step (d), a position of an upper end of the first silicon nitride film formed on the side surface of the gate electrode is higher than a position of the upper surface of the gate electrode.

According to one embodiment, reliability of the semiconductor device can be improved.

DETAILED DESCRIPTION

Figure 1:
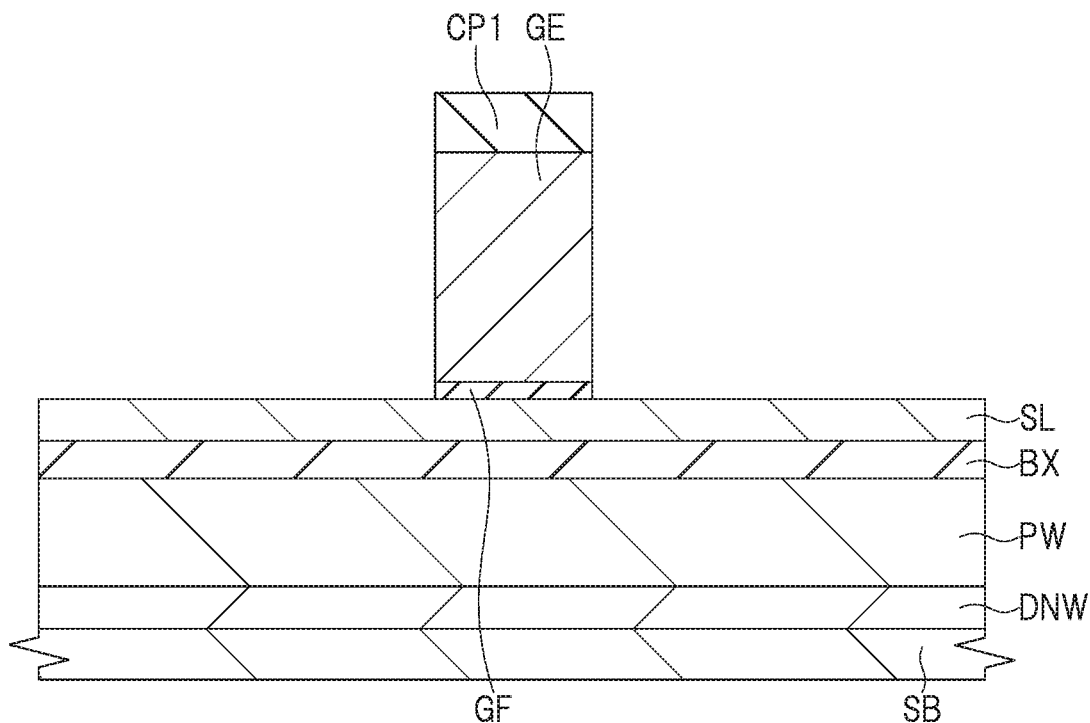
FIG. 1 is a cross-sectional view illustrating a process of manufacturing a semiconductor device according to an embodiment.

In the following embodiments, when it is necessary for convenience, the description will be made by dividing into a plurality of sections or embodiments, but except for the case specifically specified, these sections and embodiments are not independent of each other, and one of them is related to some or all of modifications, details, supplementary description, and the like of the other. In the following embodiments, the number of elements, etc. (including the number of elements, numerical values, quantities, ranges, etc.) is not limited to the specific number, but may be not less than or equal to the specific number, except for cases where the number is specifically indicated and is clearly limited to the specific number in principle. Furthermore, in the following embodiments, it is needless to say that the constituent elements (including element steps and the like) are not necessarily essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

Detailed description of each of the following embodiments is explained based on the drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

Further, in the cross-sectional view used in the embodiment, the size of each part does not correspond to the actual device, and a specific part may be displayed relatively large in order to make the drawing easy to understand. In the cut-away drawings, hatching may be omitted to make the drawings easier to see.

EMBODIMENT

The main feature of the present embodiment is to form an offset spacer composed of a multilayer film of three or more layers. Hereinafter, a manufacturing method of the semiconductor device of the present embodiment, a structure of the semiconductor device, and main features will be described with reference to FIGS. 1 to 16. Note that in this embodiment, an n-type MISFET semiconductor MISFET 1Q is formed over an SOI substrate as an example of a semiconductor device.

Method of Manufacturing Semiconductor Device

First, as shown in FIG. 1, an SOI substrate having a semiconductor substrate SB, an insulating layer BX formed on the semiconductor substrate SB, and a semiconductor layer SL formed on the insulating layer BX is prepared.

The semiconductor substrate SB is a semiconductor layer having a resistivity of, for example, 1 Ωcm to 10 Ωcm, and is made of, for example, p-type single crystal silicon. The insulating layer BX is made of, for example, silicon oxide, and the thickness of the insulating layer BX is, for example, about 10 nm to 20 nm. The semiconductor layer SL is made of, for example, silicon, and the thickness of the semiconductor layer SL is, for example, about 10 nm to 15 nm. Note that the semiconductor layer SL is an intrinsic semiconductor layer into which an n-type or p-type impurity is not introduced by ion implantation or the like. Even if a p-type impurity is introduced into the semiconductor layer SL, the impurity concentration of the semiconductor layer SL is 1×10 13 per cm 3 or less.

An example of a process of preparing such an SOI substrate will be described below. The SOI substrate can be formed by, for example, a bonding method. In the bonding method, after the surface of the first semiconductor substrate made of silicon is oxidized to form the insulating layer BX, the second semiconductor substrate made of silicon is bonded to the first semiconductor substrate by pressure bonding at a high temperature. Thereafter, the second semiconductor substrate is thinned. In this case, the thin film of the second semiconductor substrate remaining on the insulating layer BX becomes the semiconductor layer SL, and the first semiconductor substrate under the insulating layer BX becomes the semiconductor substrate SB.

Next, an n-type well region DNW and a p-type well region PW are sequentially formed in the semiconductor substrate SB by photolithography and ion implantation. A p-type ground plane region having an impurity concentration higher than that of the well region PW is formed on the surface of the well region PW in contact with the insulating layer BX, but the ground plane region is not shown here.

Next, a gate insulating film GF made of, e.g., silicon oxide is formed on the semiconductor layer SL by, e.g., thermal oxidation. The thickness of the gate insulating film GF is, for example, 1 nm to 10 nm. As a part of the gate insulating film GF, a metal oxide film (high dielectric constant film) such as a hafnium oxide film may be formed by, for example, an ALD (Atomic Layer Deposition) method.

Next, a gate electrode GE including a semiconductor layer made of, for example, polysilicon is formed on the gate insulating film GF by, for example, a CVD (Chemical Vapor Deposition) method. The thickness of the gate electrode GE is, for example, 80 nm to 120 nm. An n-type impurity is introduced into the gate electrode GE by an ion implantation method or the like. The gate electrode GE may include a semiconductor layer other than silicon, such as a silicon germanium layer, or may include not only a semiconductor layer but also a metal film such as a titanium nitride film.

Next, a cap film CP1, which is an insulating film made of silicon nitride, for example, is formed on the gate electrode GE by, e.g., CVD. The thickness of the cap film CP1 is, for example, 10 nm to 40 nm. The cap film CP1 is preferably formed of the same material as the sidewall spacer SW1 described later.

Next, the cap film CP1 and the gate electrode GE are patterned using a photolithography method and an etching process, and then the gate insulating film GF not covered with the gate electrode GE is removed by wet etching (i.e., isotropic etching) or the like, thereby forming the structure shown in FIG. 1. Note that the gate length of the gate electrode GE in this embodiment is 65 nm or less.

Figure 2:
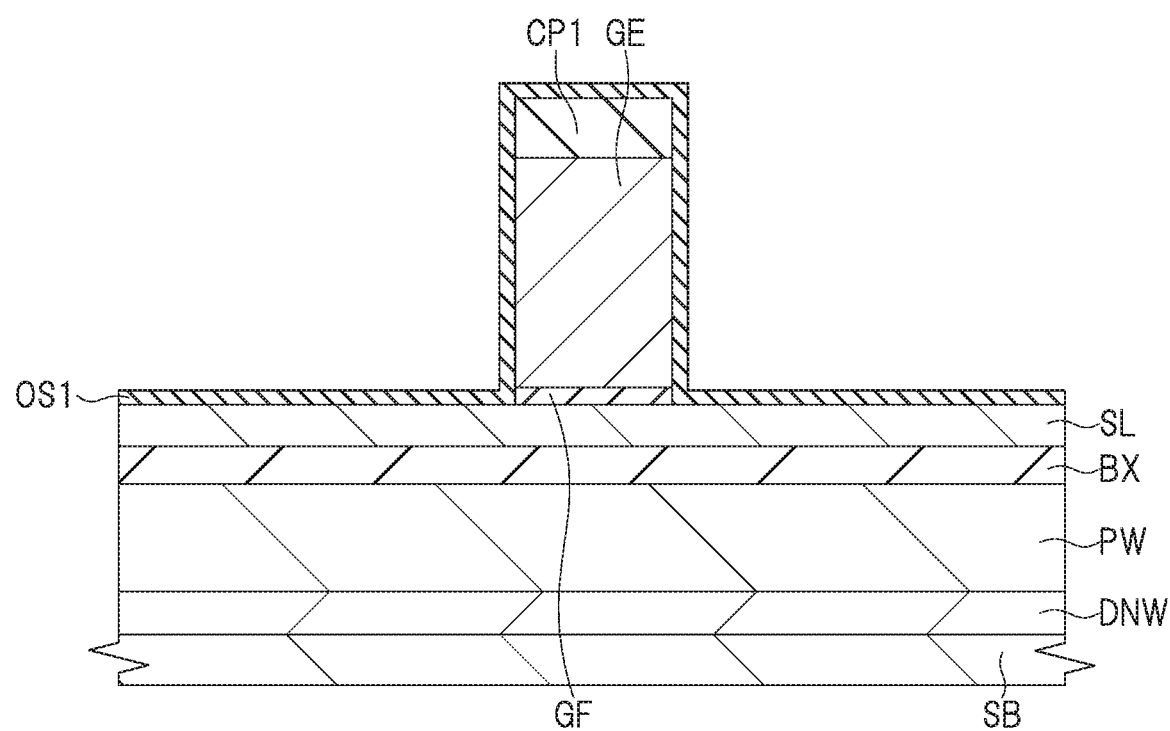
FIG. 2 is a cross-sectional view illustrating a manufacturing process subsequent to FIG. 1.

FIG. 2 shows a process of forming the insulating film OS1.

An insulating film OS1 made of, for example, silicon nitride is formed on the upper surface of the semiconductor layer SL, the side surface of the gate electrode GE, and the upper surface and the side surface of the cap film CP1 as a first-layer offset spacer by, for example, the ALD method. The thickness of the insulating film OS1 is, for example, 2 nm to 4 nm. The insulating film OS1 is formed so as to cover the entire side surface of the gate electrode GE and to be in direct contact with the side surface of the gate electrode GE. The material of the insulating film OS1 is preferably the same as the material of the cap film CP1. As will be described later in detail, the insulating film OS1 and the cap film CP1 are preferably insulating films having high resistance to a solution containing hydrofluoric acid.

Figure 3:
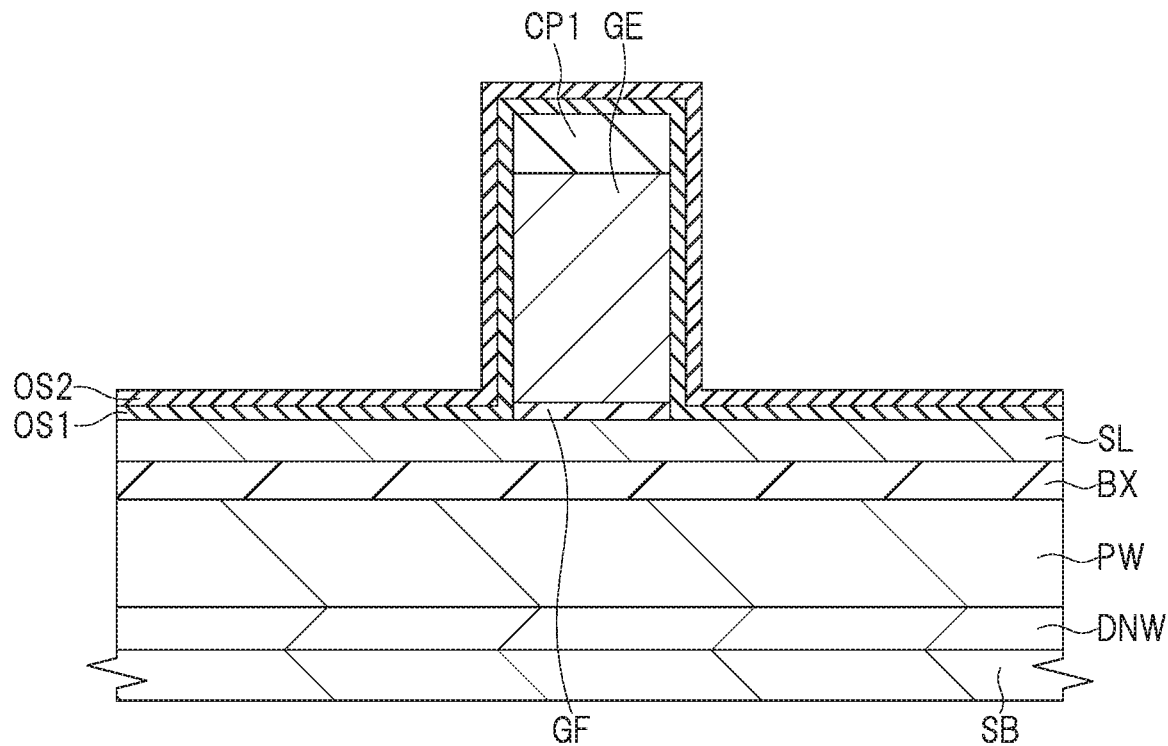
FIG. 3 is a cross-sectional view illustrating a manufacturing process subsequent to FIG. 2.

FIG. 3 shows a process of forming the insulating film OS2.

An insulating film OS2 made of, for example, silicon oxide is formed as a second-layer offset spacer on the upper surface of the semiconductor layer SL, on the side surface of the gate electrode GE, and on the upper surface and the side surface of the cap film CP1 via the insulating film OS1 by, for example, CVD. The thickness of the insulating film OS2 is, for example, 2 nm to 4 nm. The insulating film OS2 is preferably formed of a material different from that of the insulating film OS1 and the insulating film OS3 described later.

Figure 4:
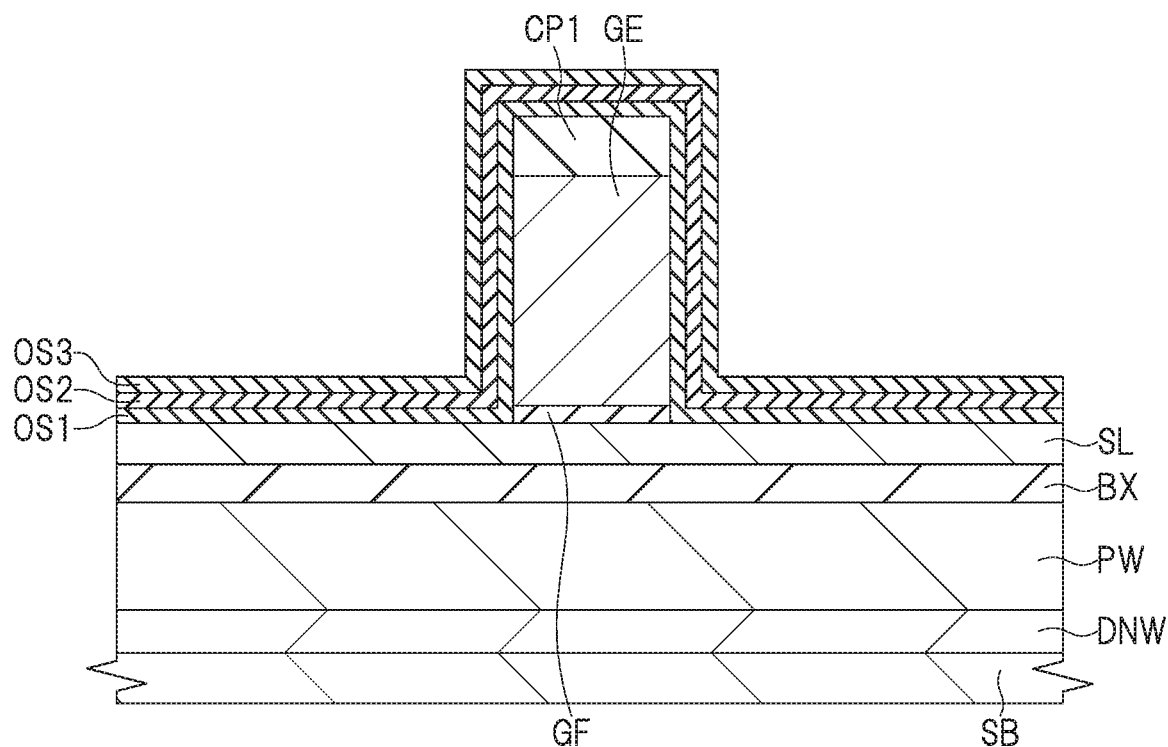
FIG. 4 is a cross-sectional view illustrating a manufacturing process subsequent to FIG. 3.

FIG. 4 shows a step of forming the insulating film OS3.

An insulating film OS3 made of, for example, silicon nitride is formed as a third-layer offset spacer by, for example, the ALD method on the upper surface of the semiconductor layer SL, the side surface of the gate electrode GE, and the upper surface and the side surface of the cap film CP1 with the insulating film OS1 and the insulating film OS2 interposed therebetween. The thickness of the insulating film OS3 is, for example, 2 nm to 4 nm. The insulating film OS3 is preferably formed of a material different from that of the insulating film OS2. The insulating film OS3, like the insulating film OS1, is preferably an insulating film having high resistance to a solution containing fluoric acid. However, if the insulating film OS3 has such resistance, it may not be a film of the same material as the insulating film OS1, for example, an acid silicon nitride film. In this manner, the insulating film OS1, the insulating film OS2, and the insulating film OS3 are formed on the side surface of the gate electrode GE, and formed in order in the direction away from the gate electrode GE, as an offset spacer. That is, the offset spacer of the present embodiment is a stacked film (laminated film) of three or more layers in which a silicon nitride film and a silicon oxide film are alternately stacked in the gate length direction. In other words, in the gate length direction, the three or more stacked films constituting the offset spacer are formed so that the materials of the insulating films adjacent to each other are different from each other.

Figure 5:
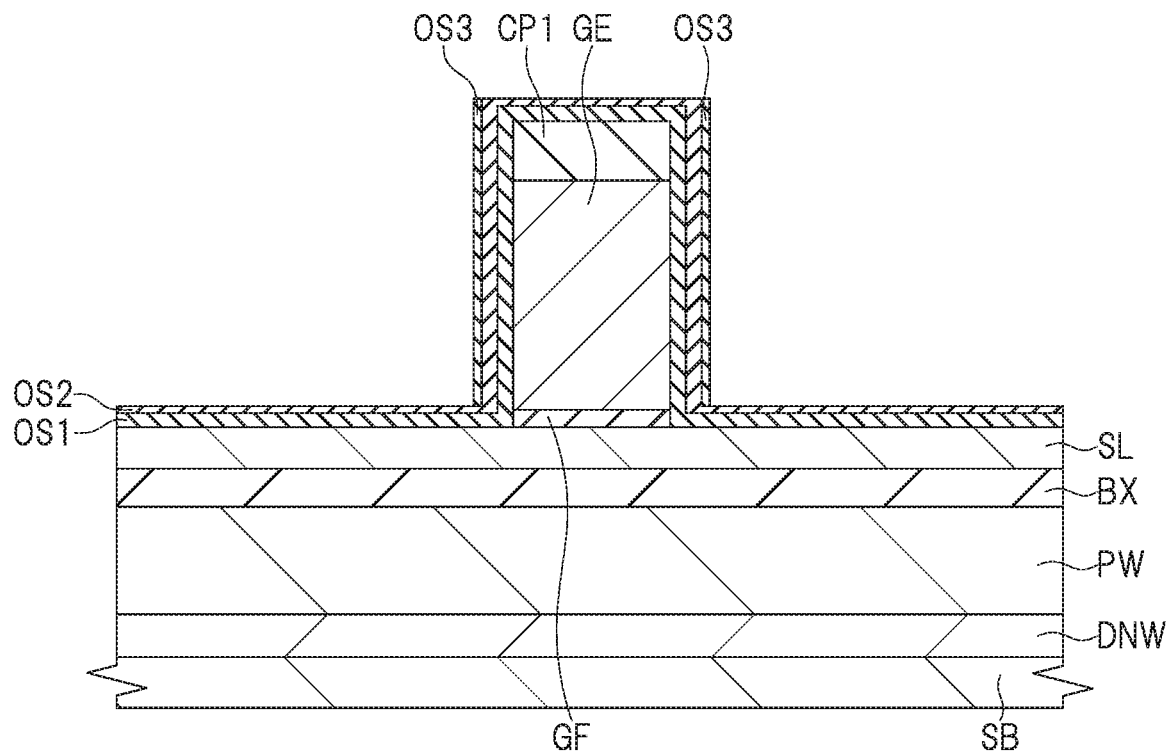
FIG. 5 is a cross-sectional view illustrating a manufacturing process subsequent to FIG. 4.

FIG. 5 shows a processing step of the insulating film OS3.

The insulating film OS3 is processed into a spacer shape by performing anisotropic etching treatment (here, dry etching treatment) on the insulating film OS3. That is, the insulating film OS3 is processed by anisotropic etching so that the insulating film OS3 on the upper surface of the semiconductor layer SL and the upper surface of the cap film CP1 is removed and the insulating film OS3 on the side surface of the gate electrode GE and the side surface of the cap film CP1 is left.

The thickness of the remaining insulating film OS3 is, for example, 0.5 nm to 2 nm. In the process of forming (or patterning) the insulating film OS3, the anisotropic etching process is performed as an overetching, but since the insulating film OS2 is not removed, the insulating film OS2 functions as an etch stopper film.

Thereafter, for the purpose of removing minute contaminants or damaged layers, the surfaces of the insulating films OS2 and OS3 are cleaned by using a solution containing a low concentration of hydrofluoric acid and hydrogen peroxide solution or the like.

After the anisotropic etching process and the cleaning process, the thickness of the insulating film OS2 on the semiconductor layer SL exposed from the insulating film OS3 is reduced to, for example, 1 nm to 2 nm. Although the insulating film OS2 on the semiconductor layer SL may be completely removed, the present embodiment exemplifies the case where the insulating film OS2 on the semiconductor layer SL is left. Further, since the insulating film OS3 on the side surface of the gate electrode GE is an insulating film having high resistance to a solution containing hydrofluoric acid, the thickness of the insulating film OS3 does not substantially change in this cleaning step.

Figure 6:
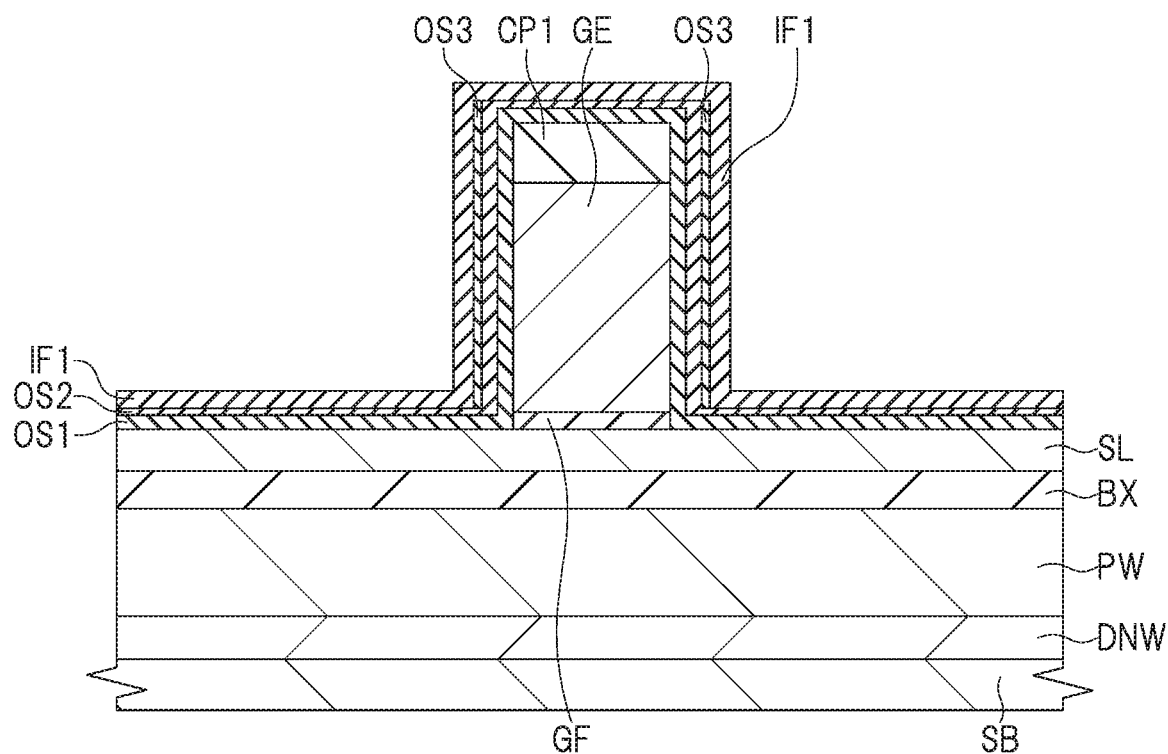
FIG. 6 is a cross-sectional view illustrating a manufacturing process subsequent to FIG. 5.

FIG. 6 shows a step of forming the insulating film IF1.

An insulating film IF1 made of, for example, silicon oxide is formed on the side surface of the gate electrode GE and the side surface of the cap film CP1 via the insulating films OS1 to OS3 and on the upper surface of the semiconductor layer SL and the upper surface of the cap film CP1 via the insulating films OS1 and OS2 by, for example, CVD. The thickness of the insulating film IF1 is, for example, 3 nm to 7 nm. The insulating film IF1 functions as an etching stopper film in a step of forming the sidewall spacer SW1 described later.

As described above, since the thickness of the insulating film OS2 is small on the upper surface of the semiconductor layer SL, the insulating film OS2 alone may not function as the etching stopper film. By forming the insulating film IF1, the insulating film OS2 and the insulating film IF1 can function as an etching stopper film. Therefore, the insulating film IF1 is preferably formed of the same material as the insulating film OS2.

In addition, the insulating film OS2 and the insulating film IF1 function as etching stopper films so that the insulating film OS1 and the insulating film OS3 are not removed even in the step of removing the sidewall spacer SW1, which will be described later. Therefore, the insulating film IF1 is preferably formed of a material different from the materials of the insulating films OS1 and OS3.

Figure 7:
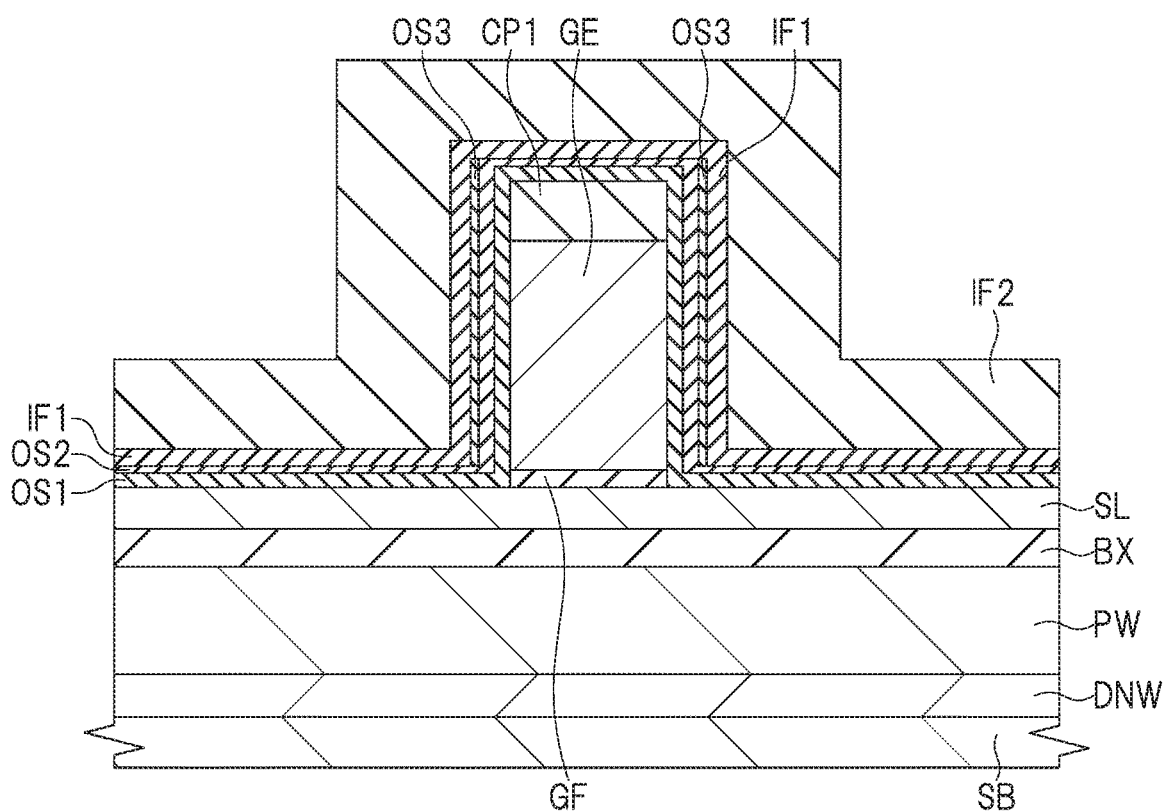
FIG. 7 is a cross-sectional view illustrating a manufacturing process subsequent to FIG. 6.

FIG. 7 shows a step of forming the insulating film IF2.

An insulating film IF2 made of, for example, silicon nitride is formed on the side surface of the gate electrode GE and the side surface of the cap film CP1 via the insulating films OS1 to OS3 and the insulating film IF1, and on the upper surface of the semiconductor layer SL and the upper surface of the cap film CP1 via the insulating film OS1, the insulating film OS2 and the insulating film IF1 by, for example, CVD. The thickness of the insulating film IF2 is, for example, 30 nm to 50 nm. Since the insulating film IF2 is processed as the sidewall spacer SW1 in the next step, it is preferable that the insulating film IF2 be formed of a material different from that of the insulating films OS2 and IF1.

Figure 8:
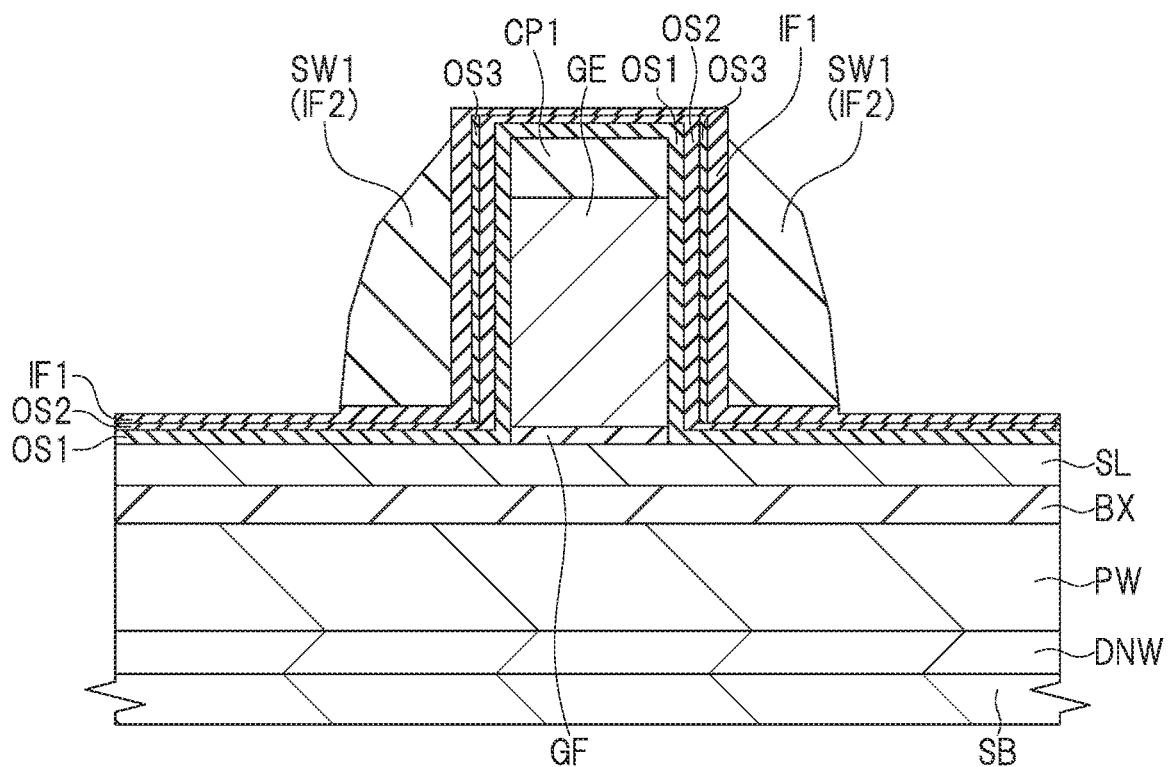
FIG. 8 is a cross-sectional view illustrating a manufacturing process subsequent to FIG. 7.

FIG. 8 shows a step of forming the sidewall spacer SW1.

The insulating film IF2 is processed into a spacer shape by performing anisotropic etching treatment on the insulating film IF2. Thereby, the insulating film IF2 on the upper surface of the semiconductor layer SL and on the upper surface of the cap film CP1 is removed, and the sidewall spacer SW1 is formed on the side surface of the gate electrode GE and on the side surface of the cap film CP1. While the insulating film IF1 and the insulating film OS2 function as etching stopper films in the processing step of the insulating film IF2, the thickness of the insulating film IF1 exposed from the sidewall spacer SW1 is slightly reduced because the anisotropic etching process is performed as an overetching. In the present embodiment, only the thickness of the insulating film IF1 covering the insulating film OS2 is thinned by the etching treatment, but the form in which the insulating film IF1 is entirely removed by the etching treatment and the thickness of the insulating film OS2 covered by the insulating film IF1 is slightly thinned is not excluded.

In this embodiment, the insulating film IF1 is provided in order to form the sidewall spacer SW1 which is a silicon nitride film, but the insulating film IF1 may not be formed in some cases. For example, when the sidewall spacer SW1 (insulating film IF2) is formed by a silicon oxide film, the insulating film IF1 may not be formed. In this case, the insulating film OS2, which is a silicon oxide film, is removed on the upper surface of the semiconductor layer SL, but the insulating film OS1, which is a silicon nitride film, can be used as an etching stopper film.

Figure 9:
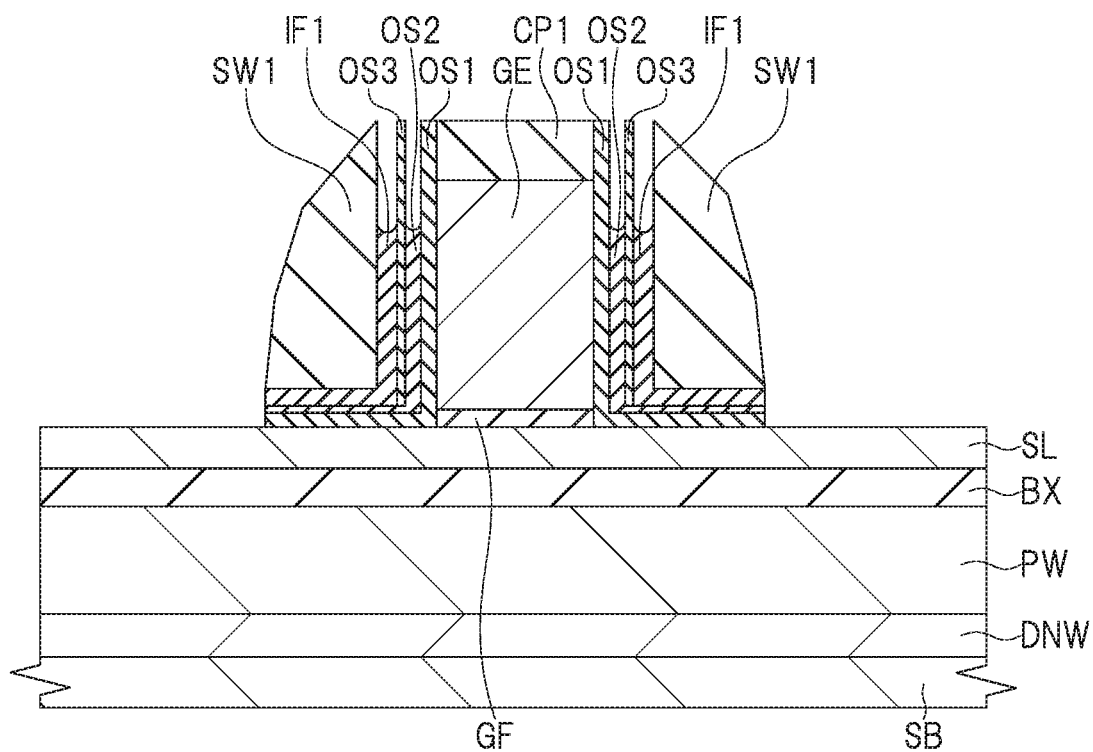
FIG. 9 is a cross-sectional view illustrating a manufacturing process subsequent to FIG. 8.

FIG. 9 shows a step of removing a part of the insulating film IF1, a part of the insulating film OS2, and a part of the insulating film OS1.

First, the insulating film IF1 and the insulating film OS2 exposed from the sidewall spacer SW1 are removed by wet etching using a solution containing hydrofluoric acid. Next, the insulating film OS1 exposed from the sidewall spacer SW1 is removed by anisotropic etching. By these etching processes, the insulating film IF1, the insulating film OS2, and the insulating film OS1 formed on the upper surface of the cap film CP1 and on the upper surface of the semiconductor layer SL are removed, and the insulating film IF1, the insulating film OS2, and the insulating film OS1 covered with the sidewall spacers SW1 are left.

Here, in the present embodiment, the insulating film OS3 is processed into a spacer shape, and the insulating film OS3 is not formed on the upper surface of the semiconductor layer SL on which the epitaxial layer EP is formed in a later step. Therefore, the manufacturing process for the etching process can be simplified.

Thereafter, for the purpose of cleaning the surface of the semiconductor layer SL, the exposed surface of the semiconductor layer SL is cleaned using a solution containing a low concentration of hydrofluoric acid and hydrogen peroxide, an aqueous solution containing ammonia and hydrogen peroxide, or the like.

Here, since the wet etching and the cleaning process are isotropic etching processes, the insulating film OS2 and the insulating film IF1 formed on the side surfaces of the gate electrode GE and the cap film CP1 recede, but the insulating film OS1, the insulating film OS3, and the sidewall spacer SW1 are hardly etched. Since the dry etching process is an anisotropic etching process, the insulating film OS1 formed on the upper surface of the semiconductor layer SL is removed, but the insulating film OS1 and the insulating film OS3 formed on the side surface of the gate electrode GE and the side surface of the cap film CP1 are left almost unetched.

Figure 10:
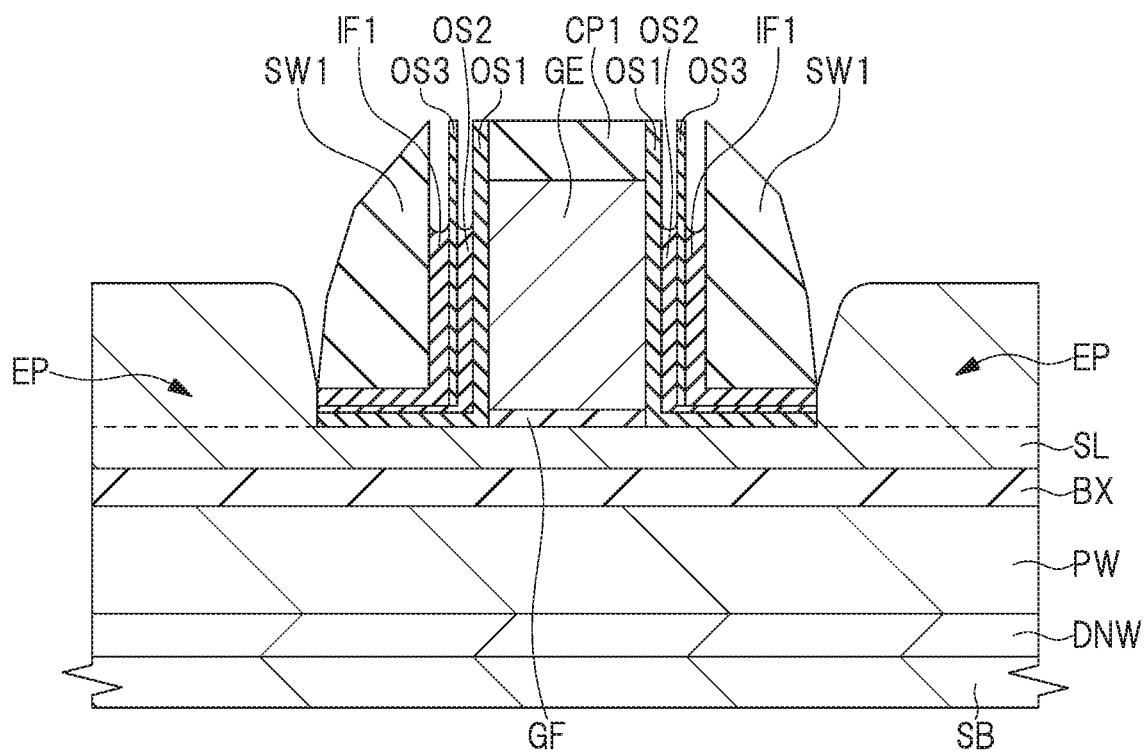
FIG. 10 is a cross-sectional view illustrating a manufacturing process subsequent to FIG. 9.

FIG. 10 shows a step of forming the epitaxial layer EP.

An epitaxial layer EP made of a semiconductor such as silicon is formed on the semiconductor layer SL exposed from the sidewall spacer SW1 by an epitaxial growth method. The thickness of the epitaxial layer EP is, for example, 20 nm to 60 nm. At this time, since the upper surface of the gate electrode GE is covered with the cap film CP1 and the entire side surface of the gate electrode GE is covered with the insulating film OS1, the epitaxial layer EP is not formed on the upper surface and the side surface of the gate electrode GE.

Although the epitaxial layer EP is integrated with the semiconductor layer SL, in the present embodiment, the epitaxial layer EP is indicated by an arrow and the boundary between the epitaxial layer EP and the semiconductor layer SL is indicated by a broken line in order to facilitate understanding of the present invention.

In the present embodiment, an insulating film made of silicon nitride is formed at a position closest to the gate electrode GE in the offset spacer (insulating film OS1 to OS3). That is, the insulating film made of silicon nitride is in direct contact with the side surface of the gate electrode GE. The insulating film made of silicon oxide is formed on the side surface of the gate electrode GE with an insulating film made of silicon nitride interposed therebetween. On the other hand, as shown in FIG. 9, on the side surface of the gate electrode GE and on the side surface of the cap film CP1, the insulating film OS2 (and the insulating film IF1) made of silicon oxide recedes, but the insulating film OS1 made of silicon nitride remains. Specifically, the position of the upper end of the insulating film OS1 is higher than the position of the upper surface of the gate electrode GE. Therefore, even if the positions of the upper ends of the insulating film OS2 and the insulating film IF1 are lower than the position of the upper surface of the gate electrode GE by wet etching using a solution containing hydrofluoric acid, the formation of the epitaxial layer EP from the side surface of the gate electrode GE can be suppressed. Therefore, it is possible to suppress a problem such as a change in the characteristics of the MISFET 1Q. In addition, although a plug PG to be described later is formed on the epitaxial layer EP, if the epitaxial layer EP is also formed from the side surface of the gate electrode GE, there is a concern that a leakage path occurs between the plug PG and the gate electrode GE, or a parasitic capacitance is increased, and the like, but in the present embodiment, these defects can be suppressed. That is, reliability of the semiconductor device can be improved.

Although the insulating film OS2 is receded by the solution used in the wet etching and the cleaning process, the amount of recession of the insulating film OS2 can be suppressed by the presence of the insulating film OS3. Therefore, the area in which the insulating film OS1 is exposed can be reduced by the recession of the insulating film OS2. That is, the solution hardly penetrates into the insulating film OS1, and the etching gas used for the anisotropic etching treatment hardly reaches the insulating film OS1. Therefore, it is possible to further suppress the possibility that the insulating film OS1 is exposed to the etching process and the side surface of the gate electrode GE is exposed. The effects of the present embodiment will be described later in detail using a study example and the like.

Figure 11:
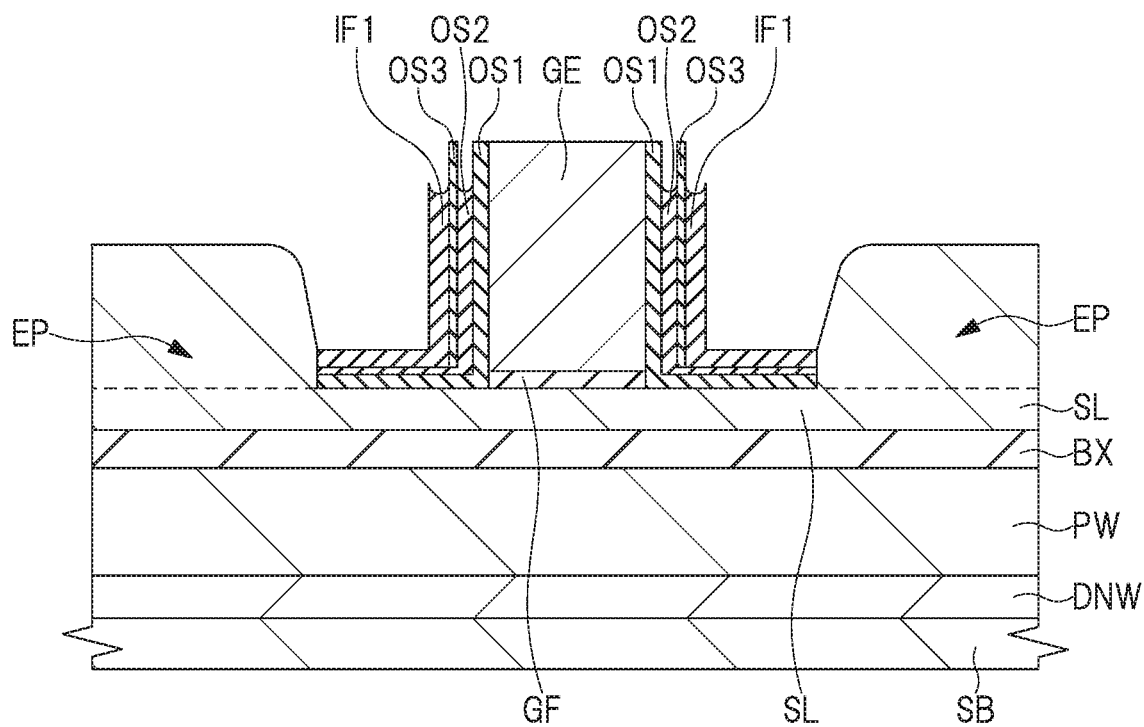
FIG. 11 is a cross-sectional view illustrating a manufacturing process subsequent to FIG. 10.

FIG. 11 shows a step of removing the sidewall spacer SW1 and the cap film CP1.

The sidewall spacer SW1 and the cap film CP1 are removed by wet etching using a solution containing phosphoric acid. At this time, since the sidewall spacer SW1 and the cap film CP1 are formed of the same material, they can be removed by the same process. The insulating film OS1 and the insulating film OS3 formed on the side surface of the cap film CP1 are also removed. When the sidewall spacer SW1 is removed, the insulating films IF1 and OS2 formed on the upper surface of the semiconductor layer SL function as etching stopper films.

Figure 12:
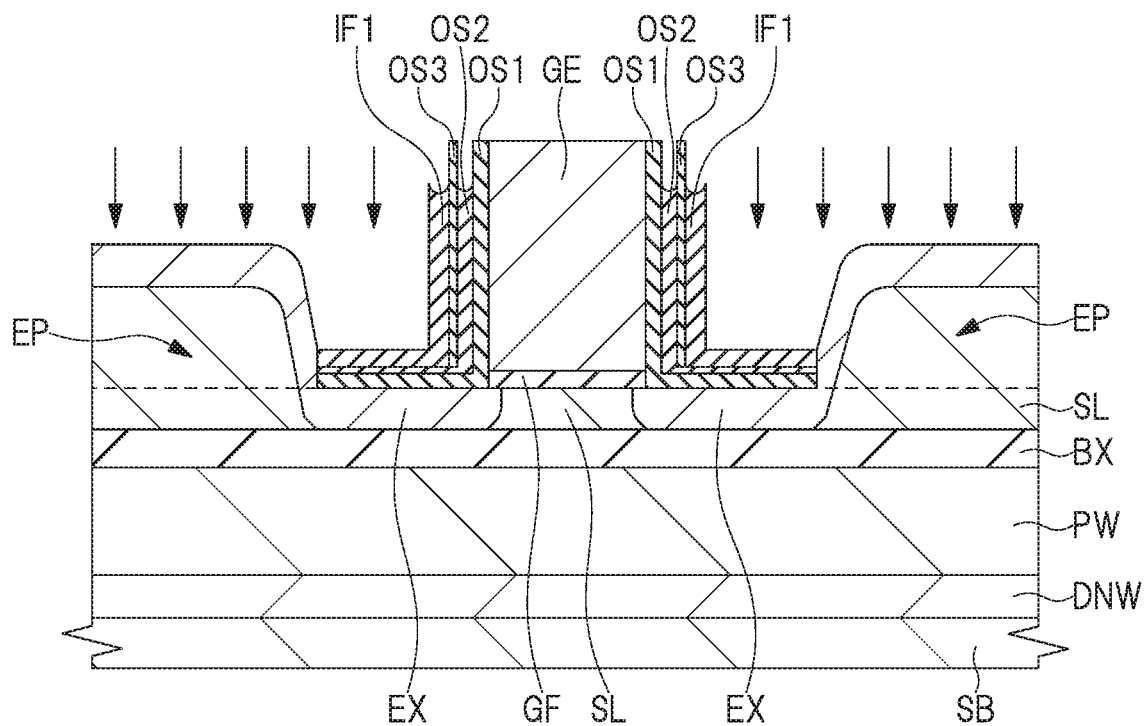
FIG. 12 is a cross-sectional view illustrating a manufacturing process subsequent to FIG. 11.

FIG. 12 shows a step of forming the extension region EX.

An n-type extension region (impurity region) EX is formed in the semiconductor layer SL and the epitaxial layer EP by ion implantation using arsenic (As), phosphorus (P), or the like into the gate electrode GE and the regions not covered with the insulating films OS1 to OS3 and the insulating film IF1 formed on the side surfaces of the gate electrode GE. Here, in the present embodiment, ions are implanted from the upper side of the semiconductor layer SL as indicated by arrows shown in FIG. 12. That is, the extension region EX is formed by using a stacked film including the insulating films OS1 to OS3 and the insulating film IF1 which are offset spacers as a mask. The extension region EX forms a part of a source region or a part of a drain region of the MISFET 1Q. Thereafter, heat treatment is performed to diffuse the impurity contained in the extension region EX.

Through these processes, as shown in FIG. 12, the end portion of the extension region EX is adjusted so as to be located below the gate electrode GE. The position of the extension region EX is generally determined by the sum of the thicknesses of the insulating films OS1 to OS3 and the insulating film IF1 formed on the side surface of the gate electrode GE in consideration of the diffusion by the heat treatment. In the present embodiment, since the gate length of the gate electrode GE is 65 nm or less and the MISFET 1Q of the gate electrode GE is a fine device, the position at which the extension region EX is formed is a critical parameter in determining the characteristics of the MISFET 1Q. Therefore, controlling the thicknesses of the insulating films OS1 to OS3 and the insulating film IF1, which are offset spacers, with high accuracy leads to an improvement in the performance of the MISFET 1Q.

In the present embodiment, various etching processes are performed before the process of forming the extension region EX, but the thicknesses of the insulating films OS1 to OS3 and the insulating film IF1 formed on the side surfaces of the gate electrode GE are hardly changed by these etching processes. That is, the thickness of each of the insulating films OS1 to OS3 and the insulating film IF1 is accurately maintained so as to be the thickness at the time of device design. Therefore, the position at which the extension region EX is formed can be controlled with high accuracy. For this reason, the insulating film IF1 can be seen as a part of the offset spacer together with the insulating films OS1 to OS3.

As described above, the insulating film IF1 may not be formed. At this time, the formation position of the extension region EX can be controlled by slightly changing the thickness of each of the insulating films OS1 to OS3 serving as the offset spacers. That is, even if the insulating film IF1 does not exist and only the insulating films OS1 to OS3 exist, the thicknesses of the insulating films OS1 to OS3 are maintained as described above, so that the formation position of the extension region EX can be accurately controlled.

An insulating film OS1, an insulating film OS2, and an insulating film IF1 are formed on the upper surface of the semiconductor layer SL in which the extension region EX is formed, and these insulating films serve to reduce damage to the semiconductor layer SL at the time of ion implantation. The total thickness of these insulating films is smaller than the total thickness of the insulating films OS1 to OS3 and the insulating film IF1 formed on the side surface of the gate electrode GE by at least the thickness of the insulating film OS3. Therefore, the total thickness of these insulating films is a thickness through which ions for forming the extension region EX can pass. If the thickness of each insulating film formed on the upper surface of the semiconductor layer SL is large, there is a possibility that a problem that ions cannot pass through each insulating film may occur even if the energy of ion implantation is increased, but in the present embodiment, such a problem can be suppressed.

Figure 13:
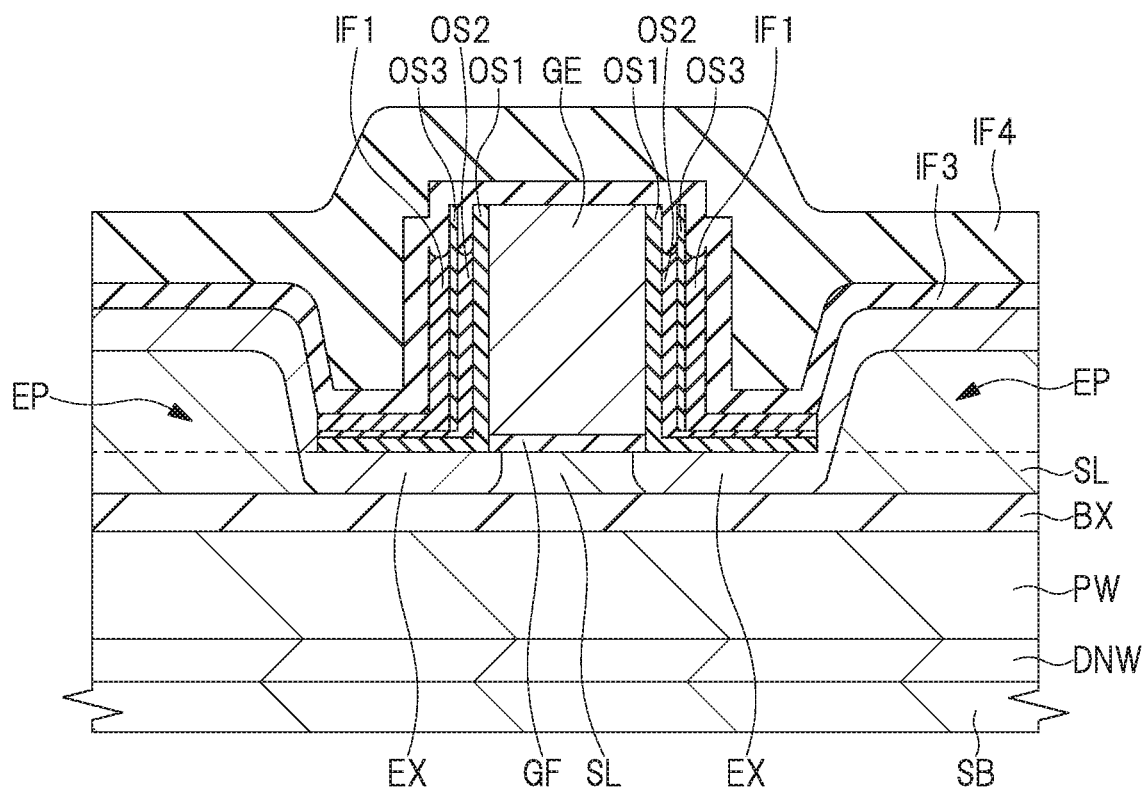
FIG. 13 is a cross-sectional view illustrating a manufacturing process subsequent to FIG. 12.

FIG. 13 shows a step of forming the insulating films IF3 and IF4.

An insulating film IF3 and an insulating film IF4 are sequentially formed on the upper surface of the gate electrode GE, on the upper surface of the epitaxial layer EP, on the side surface of the gate electrode GE via the insulating films OS1 to OS3 and the insulating film IF1, and on the upper surface of the semiconductor layer SL via the insulating film OS1, the insulating film OS2 and the insulating film IF1 by, for example, the CVD method. Since the insulating film IF3 functions as an etching stopper film when the sidewall spacer SW2 is formed in the next step, it is preferable that the insulating film IF3 be formed of a material different from that of the insulating film IF4. Here, the insulating film IF3 is, for example, a silicon oxide film, and the insulating film IF4 is, for example, a silicon nitride film. An insulating film IF3 is formed above the insulating film OS2 and the insulating film IF1 that have receded.

Figure 14:
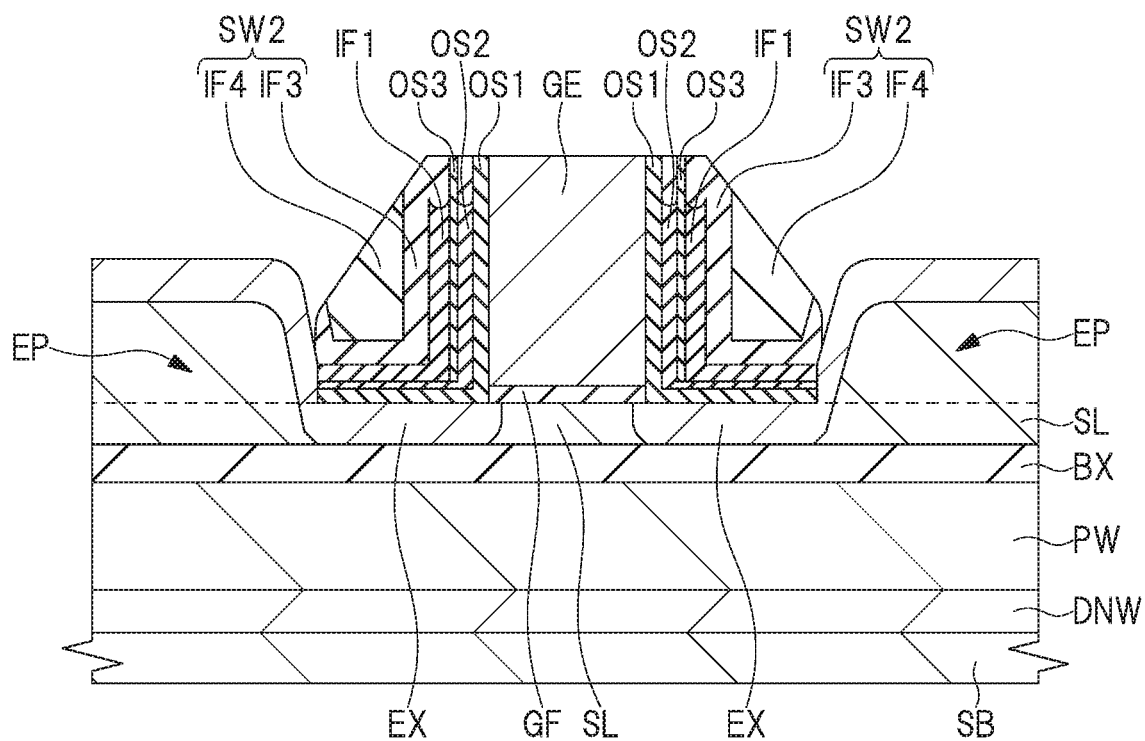
FIG. 14 is a cross-sectional view illustrating a manufacturing process subsequent to FIG. 13.

FIG. 14 shows a step of forming the sidewall spacer SW2.

First, the insulating film IF4 is processed into a spacer shape by performing anisotropic etching treatment on the insulating film IF4. This anisotropic etching process is performed as an overetching, but the insulating film IF3 functions as an etching stopper film. Next, the insulating film IF3 formed on the upper surface of the gate electrode GE and on the upper surface of the epitaxial layer EP is removed by wet etching using a solution containing hydrofluoric acid. As a result, the sidewall spacer SW2 composed of the insulating film IF3 and the insulating film IF4 is formed on the side surface of the gate electrode GE with the insulating films OS1 to OS3 and the insulating film IF1 interposed therebetween. An end portion of the sidewall spacer SW2 is located on the epitaxial layer EP.

Figure 15:
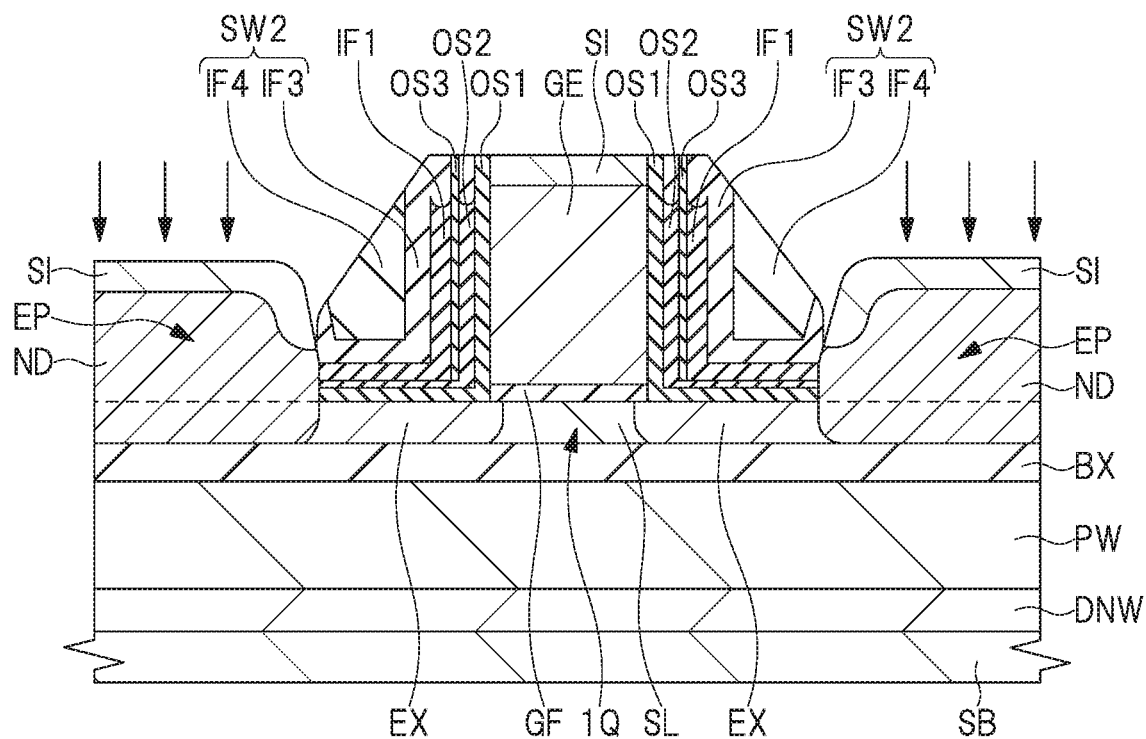
FIG. 15 is a cross-sectional view illustrating a manufacturing process subsequent to FIG. 14.

FIG. 15 shows a process of forming the diffusion region ND and the silicide layer SI.

First, an n-type diffusion region (impurity region) ND is formed in the epitaxial layer EP and the semiconductor layer SL by ion implantation using arsenic (As), phosphorus (P), or the like. Here, in the present embodiment, ions are implanted from the upper side of the semiconductor layer SL as indicated by arrows shown in FIG. 15. The diffusion region ND has an impurity concentration higher than that of the extension region EX, and the diffusion region ND is connected to the extension region EX to form a part of a source region or a part of a drain region of the MISFET 1Q.

Next, low-resistance silicide layers SI are formed on the upper surface of each of the diffused regions ND and the gate electrode GE by Salicide (Self Aligned Silicide).

Specifically, the silicide layer SI can be formed as follows. First, a metal film for forming a silicide layer SI is formed so as to cover the gate electrode GE, the insulating films OS1 to OS3, the insulating film IF1, the sidewall spacer SW2, and the diffusion region ND. The metal film is made of, for example, cobalt, nickel, or nickel platinum alloy. Next, the semiconductor substrate SB is subjected to a first heat treatment at about 300 to 400° C., and then subjected to a second heat treatment at about 600 to 700° C., whereby the material included in the diffusion region ND and the gate electrode GE and the metal film are caused to react with each other. As a result, the silicide layer SI is formed on the upper surface of the diffusion region ND and the upper surface of the gate electrode GE. Thereafter, the unreacted metal film is removed.

In the present embodiment, it is possible to suppress such a problem that the epitaxial layer EP is formed from the side surface of the gate electrode GE. Therefore, there is no problem that the epitaxial layer EP on the side surface of the gate electrode GE is silicided.

In the present embodiment, the silicide layer SI is formed on a region of the epitaxial layer EP exposed from the sidewall spacer SW2. By positioning the end portion of the sidewall spacer SW2 on the epitaxial layer EP, the silicide layer SI can be prevented from excessively growing until it reaches the semiconductor layer SL under the gate electrode GE.

As described above, the MISFET 1Q which is the semiconductor device of the present embodiment is manufactured.

Figure 16:
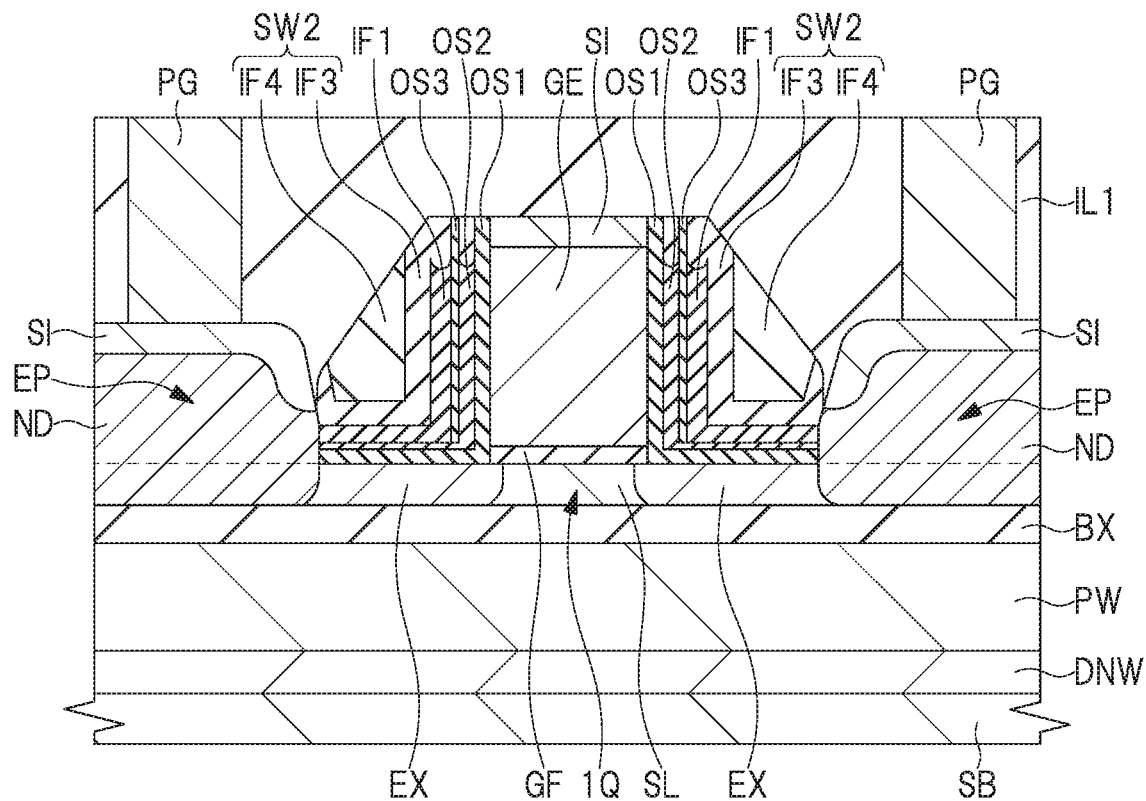
FIG. 16 is a cross-sectional view illustrating a manufacturing process subsequent to FIG. 15.

FIG. 16 shows a step of forming the interlayer insulating film IL1 and the plug PG.

First, an interlayer insulating film IL1 made of, for example, a silicon oxide film is formed by, for example, a CVD method so as to cover the MISFET 1Q. Next, a contact hole is formed in the interlayer insulating film IL1 by a photolithography method and an etching process. Next, a barrier metal film made of titanium nitride and a conductive film made of tungsten are buried in the contact hole to form a plug PG in the interlayer insulating film IL1. The plug PG is electrically connected to the diffusion region ND via the silicide layer SI. Although not shown, the plug PG is also formed on the gate electrode GE via the silicide layer SI.

Structure of Semiconductor Device

A structure of a MISFET 1Q which is a semiconductor device of the present embodiment manufactured by the above-described manufacturing process will be briefly described with reference to FIG. 16.

An insulating layer BX is formed on the semiconductor substrate SB, and a semiconductor layer SL is formed on the insulating layer BX. The thickness of the insulating layer BX is about 10 nm to 20 nm, and the thickness of the semiconductor layer SL is about 10 nm to 15 nm.

An n-type well region DNW is formed in the semiconductor substrate SB, and a p-type well region PW is formed in the well region DNW. Although not shown, a p-type ground plane region having an impurity concentration higher than that of the well region PW is formed on the surface of the well region PW in contact with the insulating layer BX. The ground plane region of the well region PW is a region to which a voltage differing from those of the gate electrode GE is applied, and together with the gate electrode GE, the ground plane region of the well region PW is a region for controlling the driving current of the MISFET 1Q. That is, the well region PWs can function as second gate electrode of the MISFET 1Q.

A gate electrode GE is formed on the semiconductor layer SL with a gate insulating film GF interposed therebetween. Here, the gate insulating film GF is a single layer film made of an insulating film such as a silicon oxide film, or a laminated film having a silicon oxide film and a metal oxide film such as a hafnium oxide film. The gate electrode GE includes, for example, a semiconductor layer made of n-type polycrystalline silicon. The gate electrode GE may include not only a semiconductor layer but also a metal film such as a titanium nitride film.

On the side surface of the gate electrode GE, insulating films OS1 to OS3 and an insulating film IF1 are formed as offset spacers. The insulating film OS1 is, for example, a silicon nitride film, the insulating film OS2 is, for example, a silicon oxide film, the insulating film OS3 is, for example, a silicon nitride film, and the insulating film IF1 is, for example, a silicon oxide film. That is, the offset spacer of the present embodiment is a stacked film of three or more layers in which a silicon nitride film and a silicon oxide film are alternately stacked in the gate length direction. In other words, in the gate length direction, the three or more stacked films constituting the offset spacer are formed so that the materials of the insulating films adjacent to each other are different from each other.

On the side surface of the gate electrode GE, the thickness of the insulating film OS1 is, for example, 2 nm to 4 nm, the thickness of the insulating film OS2 is, for example, 2 nm to 4 nm, the thickness of the insulating film OS3 is, for example, 0.5 nm to 2 nm, and the thickness of the insulating film IF1 is, for example, 3 nm to 7 nm. The position of the upper end of the insulating film OS1 is higher than the position of the upper surface of the gate electrode GE.

The insulating film OS1, the insulating film OS2, and the insulating film IF1 are also formed on the upper surface of the semiconductor layer SL. On the upper surface of the semiconductor layer SL, the thickness of the insulating film OS1 is, for example, 2 nm to 4 nm, the thickness of the insulating film OS2 is, for example, 1 nm to 2 nm, and the thickness of the insulating film IF1 is, for example, 3 nm to 7 nm. As described above, the total thickness of each insulating film on the upper surface of the semiconductor layer SL is smaller than the total thickness of each insulating film on the side surface of the gate electrode GE.

Although the insulating film IF1 is not formed in some cases as described in the above manufacturing method, the present embodiment illustrates the case where the insulating film IF1 is formed.

An epitaxial layer EP made of, for example, silicon is formed on the upper surface of the semiconductor layer SL not covered with the insulating films OS1 to OS3 and the insulating film IF1.

A sidewall spacer SW2 composed of an insulating film IF3 and an insulating film IF4 is formed on the side surface of the gate electrode GE with the insulating films OS1 to OS3 and the insulating film IF1 interposed therebetween. An end portion of the sidewall spacer SW2 is located on the epitaxial layer EP.

Extension regions EX, which are low-concentration n-type impurity regions, are formed in the semiconductor layers SL below the insulating films OS1 to OS3 and the sidewall spacers SW2. In the epitaxial layer EP and the semiconductor layer SL exposed from the sidewall spacer SW2, a diffusion region ND, which is an n-type impurity region having a higher concentration than the extension region EX, is formed. The extension regions EX and the diffused regions ND constitute a part of the source region and a part of the drain region of the MISFET 1Q, respectively.

Silicide layer SI made of, for example, nickel silicide (NiSi) or cobalt silicide (CoSi) 2 is formed on each of the upper surface of the gate electrode GE and the diffusion region ND in order to reduce the contact resistance between the gate electrode GE and the diffusion region ND.

In the MISFET 1Q of the present embodiment, as described above, the insulating films OS1 to OS3, which are an offset spacer, can mainly suppress a problem in which the epitaxial layer EP is formed from the side surface of the gate electrode GE, and the position where the extension region EX is formed can be controlled with high accuracy. Therefore, the reliability of the semiconductor device can be improved.

Comparison Between Examined Example and Present Embodiment

Hereinafter, main features of the present embodiment will be described by using Examined Example 1 and Examined Example 2. Hereinafter, differences between the present embodiment and the first and second examined examples will be mainly described. It should be noted that Examined Example 1 and Examined Example 2 are not publicly known techniques, but are newly examined by the inventor of the present application.

Examined Example 1

Figure 19:
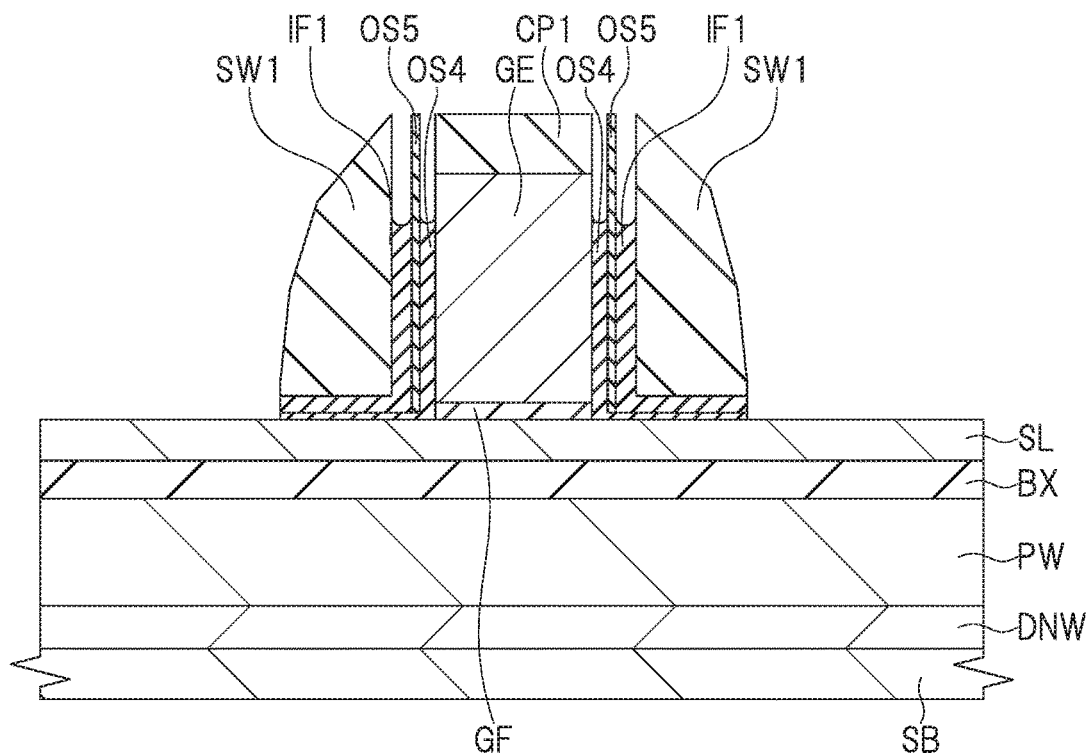
FIG. 19 is a cross-sectional view illustrating a manufacturing process of a semiconductor device according to Examined Example 1.

Referring to FIG. 19, a semiconductor device of a first study example will be described. FIG. 19 is a cross-sectional view during the manufacturing process of the semiconductor device of Examined Example 1, and is a cross-sectional view corresponding to FIG. 9 of the present embodiment.

In the first study example, an insulating film OS4 and an insulating film OS5 different from the insulating films OS1 to OS3 of the present embodiment are formed as offset spacers between the gate electrode GE and the sidewall spacer SW1. The insulating film OS4 is made of a silicon oxide film and is in direct contact with the side surface of the gate electrode GE. The insulating film OS5 is made of a silicon nitride film, and is formed on the side surface of the gate electrode GE with the insulating film OS4 interposed therebetween.

In Examined Example 1, as in the process of FIG. 9 of the present embodiment, wet etching using a solution containing hydrofluoric acid is performed in order to remove the insulating film IF1 and the insulating film OS4 exposed from the sidewall spacer SW1, and thereafter, a cleaning process using a solution containing a low concentration of hydrofluoric acid and a hydrogen peroxide solution is performed in order to clean the surface of the semiconductor layer SL.

Therefore, as shown in FIG. 19, the insulating film OS5 in contact with the side surface of the gate electrode GE may recede, and the side surface of the gate electrode GE may be exposed. Then, during the next step of forming the epitaxial layer EP, the epitaxial layer EP is formed not only on the upper surface of the semiconductor layer SL but also on the side surface of the gate electrode GE. Therefore, it is difficult to improve the reliability of the semiconductor device in Examined Example 1.

On the other hand, in the present embodiment, as shown in FIG. 9, the insulating film OS1 having high resistance to hydrofluoric acid is formed at the position closest to the gate electrode GE in the offset spacers OS1 to OS3, and is formed so as to be in direct contact with the side surface of the gate electrode GE and the side surface of the cap film CP1. Specifically, the height of the upper end of the insulating film OS1 is higher than the position of the upper surface of the gate electrode GE. Therefore, it is possible to prevent the epitaxial layer EP from being formed on the side surface of the gate electrode GE in the process of forming the epitaxial layer EP. Therefore, it is possible to suppress a problem such as a change in the characteristics of the MISFET1Q. In addition, it is possible to suppress a problem such as a leakage path or an increase in parasitic capacitance between the plug PG and the gate electrode GE. That is, reliability of the semiconductor device can be improved.

Examined Example 2

With reference to FIGS. 20 to 23, a semiconductor device of a second study example will be described. FIGS. 20 to 23 are cross-sectional views during the manufacturing process of the semiconductor device of Examined Example 1.

In the present embodiment, the insulating films OS1 to OS3 are formed as the offset spacers; however, in Examined Example 2, the insulating film OS3 is not formed, and only the insulating film OS1 which is a silicon nitride film and the insulating film OS2 which is a silicon oxide film are formed as the offset spacers.

Figure 20:
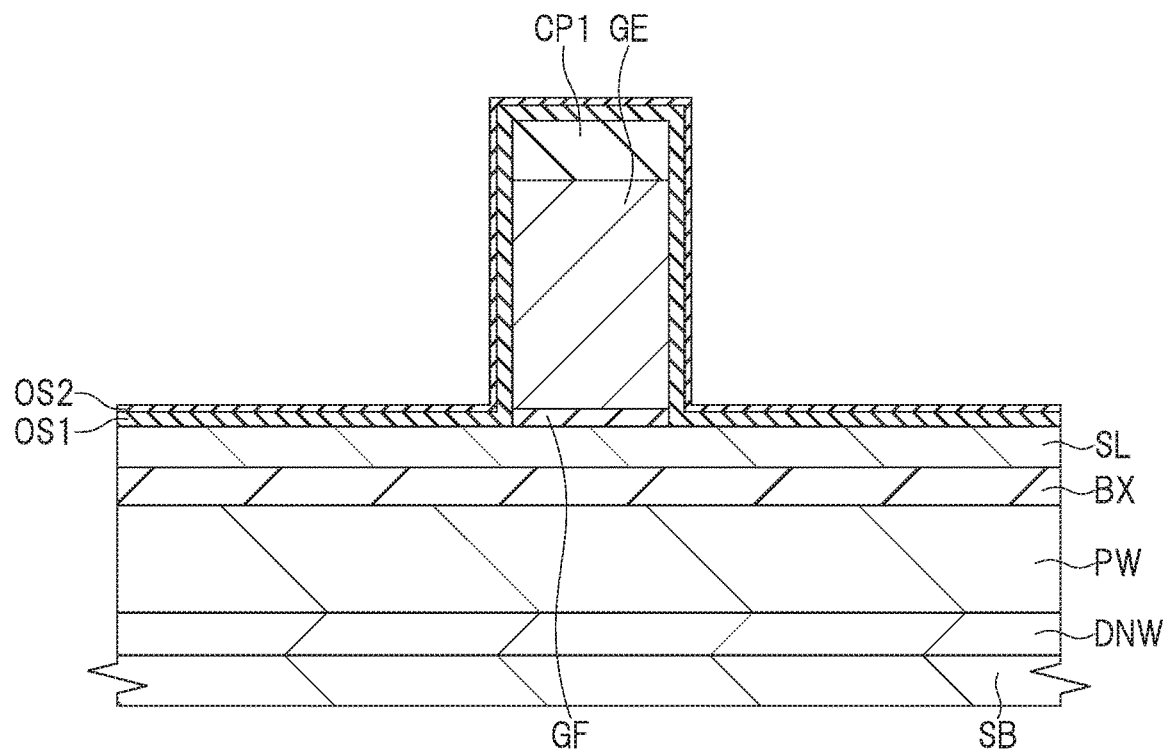
FIG. 20 is a cross-sectional view illustrating a manufacturing process of a semiconductor device according to Examined Example 2.

FIG. 20 is a cross-sectional view corresponding to FIG. 5 of the present embodiment. In Examined Example 2, similarly to the present embodiment, the surface of the insulating film OS2 is cleaned by using a solution containing a low concentration of hydrofluoric acid and hydrogen peroxide solution for the purpose of removing a minute contaminant or a damaged layer. At this time, as shown in FIG. 20, in Examined Example 2, since the insulating film OS3 is not formed, not only the insulating film OS2 on the upper surface of the semiconductor layer SL but also the insulating film OS2 on the side surface of the gate electrode GE recedes.

The thinning of the thickness of the insulating film OS2 on the side surface of the gate electrode GE means that the position where the subsequent extension region EX is formed is deviated from the position at the time of device design. Therefore, in the second study example, it is necessary to increase the thickness of the insulating film IF1 in order to compensate for the thinning of the insulating film OS2.

Figure 21:
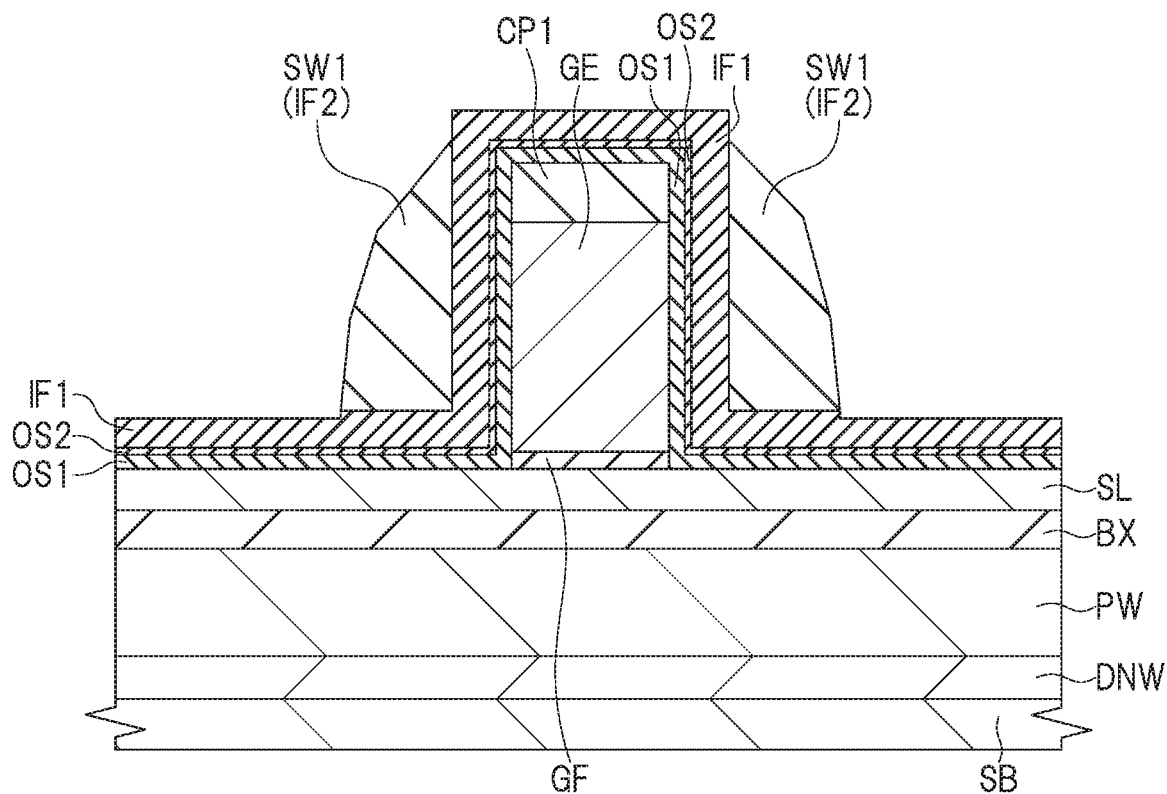
FIG. 21 is a cross-sectional view illustrating a manufacturing process subsequent to FIG. 20.

FIG. 21 is a cross-sectional view of the manufacturing process subsequent to FIG. 20, and is a cross-sectional view corresponding to FIG. 8 of the present embodiment.

As described above, the insulating film IF1 of the examined example 2 is formed to be thicker than the insulating film IF1 of the present embodiment. Thereafter, the sidewall spacer SW1 made of the insulating film IF2 is formed in the same manner as in the present embodiment.

Figure 22:
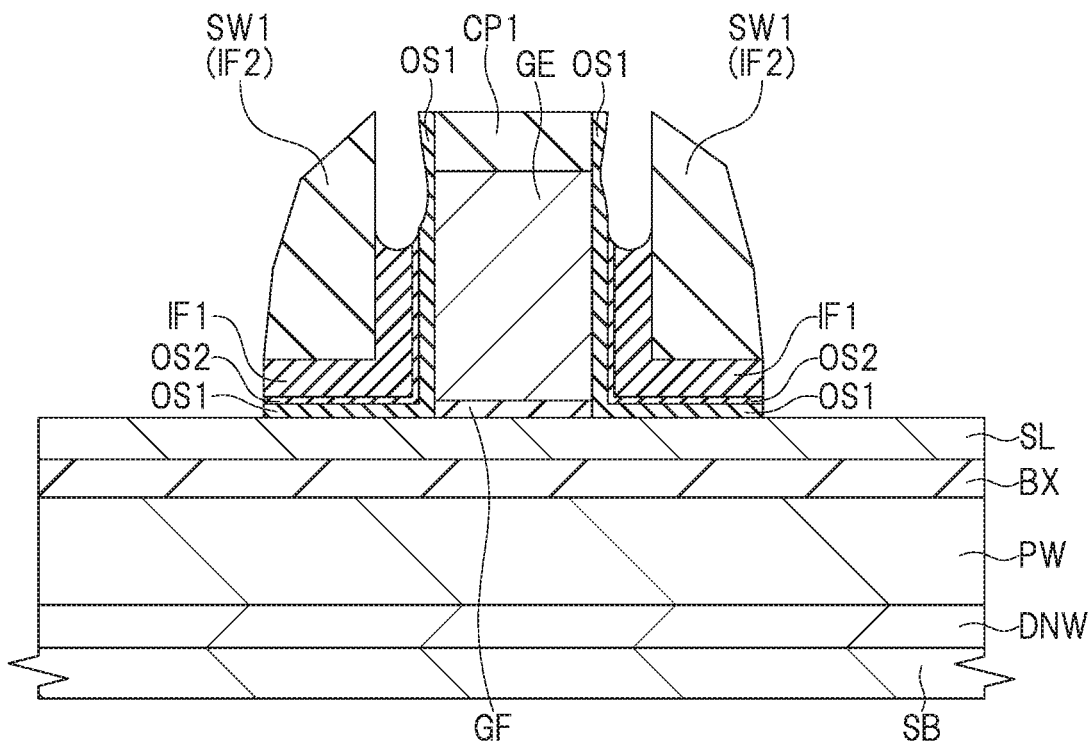
FIG. 22 is a cross-sectional view illustrating a manufacturing process subsequent to FIG. 21.

FIG. 22 is a cross-sectional view of the manufacturing process subsequent to FIG. 21, and is a cross-sectional view corresponding to FIG. 9 of the present embodiment, and shows the first problem of Examined Example 2.

In Examined Example 2, similarly to the present embodiment, the insulating film IF1 and the insulating film OS2 exposed from the sidewall spacer SW1 are removed by wet etching using a solution containing hydrofluoric acid. Next, the insulating film OS1 exposed from the sidewall spacer SW1 is removed by anisotropic etching. Thereafter, for the purpose of cleaning the surface of the semiconductor layer SL, the exposed surface of the semiconductor layer SL is cleaned by using a solution containing a low concentration of hydrofluoric acid and hydrogen peroxide solution or the like.

In Examined Example 2, unlike Examined Example 1, the insulating film OS1, which is a silicon nitride film, is in direct contact with the side surface of the gate electrode GE. Therefore, the study example 2 is superior to the study example 1 in that the formation of the epitaxial layer EP from the side surface of the gate electrode GE can be suppressed.

However, in Examined Example 2, the insulating film OS2 and the insulating film IF1 formed on the side surface of the gate electrode GE and on the side surface of the cap film CP1 by the solution used in the wet etching and the cleaning process are more receded than in the present embodiment. This is because the wet etching time required for removing the insulating film IF1 formed on the upper surface of the semiconductor layer SL becomes longer because the thickness of the insulating film IF1 is increased. Further, in Examined Example 2, since the insulating film OS3 of the present embodiment does not exist, the insulating film OS2 which is a silicon oxide film and the insulating film IF1 are in direct contact with each other. Therefore, since the area of the silicon oxide film in contact with the solution is large, the insulating film OS2 and the insulating film IF1 tend to recede.

When the amount of recession of each of the insulating film OS2 and the insulating film IF1 is increased, the exposed area of the insulating film OS1 is also increased. The insulating film OS1 has high resistance to hydrofluoric acid, but may be slightly etched. Further, the risk of etching the insulating film OS1 having a large exposed area is increased by the anisotropic etching process. FIG. 22 shows such a state in which the insulating film OS1 on the side surface of the gate electrode GE is etched and the thickness thereof is reduced. In some circumstances, there is a possibility that a part of the insulating film OS1 is separated, and the side surface of the gate electrode GE is exposed.

On the other hand, in this embodiment, as shown in FIG. 9, the insulating film OS3 is present, so that the area where the insulating film OS2 contacts the solution can be reduced. That is, since the insulating film OS2 exists in a narrow region between the insulating film OS1 and the insulating film OS3, the solution hardly penetrates into the narrow region. Therefore, the amount of recession of the insulating film OS2 can be suppressed.

Since the amount of recession of the insulating film OS2 is small, the area where the insulating film OS1 is exposed is also small. Therefore, it is possible to suppress the possibility that the insulating film OS1 is etched by the anisotropic etching process. As a result, it is possible to suppress the possibility that the side surface of the gate electrode GE is exposed.

Figure 23:
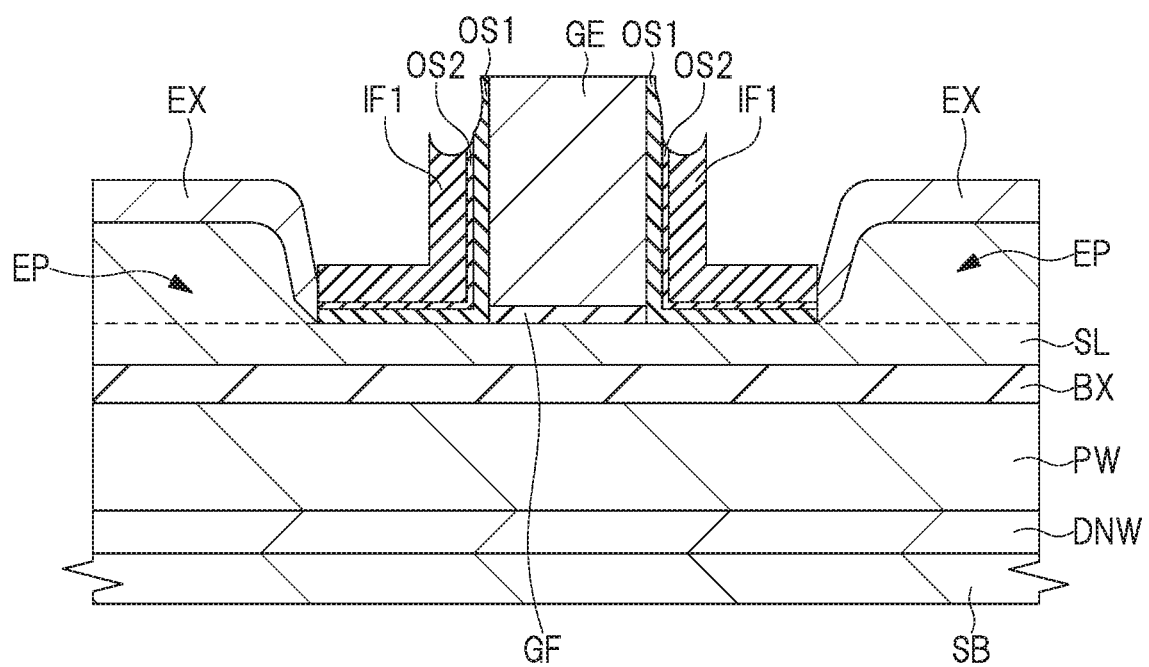
FIG. 23 is a cross-sectional view illustrating a manufacturing process subsequent to FIG. 22.

FIG. 23 is a cross-sectional view of the manufacturing process subsequent to FIG. 22, and is a cross-sectional view corresponding to FIG. 12 of the present embodiment, and shows the second problem of Examined Example 2.

In Examined Example 2, similarly to the present embodiment, after the step of forming the epitaxial layer EP and the step of removing the sidewall spacer SW1, ion implantation for forming the extension region EX is performed.

Here, in the second example, since the thickness of the insulating film IF1 is increased for the purpose of compensating the thickness of the offset spacer, the total of the thicknesses of the insulating film OS1, the insulating film OS2, and the insulating film IF1 on the upper surface of the semiconductor layer SL in which the extension region EX is formed is larger than that in the present embodiment. Therefore, the total thickness of these insulating films may be a thickness through which ions cannot pass or a thickness through which ions cannot pass. FIG. 23 shows a case where ions cannot pass through the respective insulating films and an extension region EX is not formed in the semiconductor layer SL.

In contrast, in the present embodiment, the insulating film IF1 only needs to function as an etching stopper film at the time of processing and removing the sidewall spacer SW1, and the thickness of the insulating film IF1 does not need to be thicker than necessary. In other words, the insulating film IF1 may not be formed in some cases. In other words, in the present embodiment, since the thickness of each of the insulating films OS1 to OS3 is accurately maintained on the side surface of the gate electrode GE, the thickness of the insulating film IF1 does not need to be thicker than necessary. Further, since the insulating film OS3 is processed into a spacer shape, the insulating film OS3 does not contribute to the thickness of each insulating film on the upper surface of the semiconductor layer SL at the time of ion implantation.

As described above, in the present embodiment, since the total thickness of each insulating film can be made as small as possible on the upper surface of the semiconductor layer SL, it is possible to suppress the possibility of occurrence of a problem such as the failure of ions to reach the semiconductor layer SL or the failure of ions to reach the semiconductor layer SL.

As described above, reliability of the semiconductor device can be improved by using the technique disclosed in this embodiment mode.

In addition, in this embodiment mode, a stacked film including the insulating films OS1 to OS3 is exemplified as the three-layer offset spacer, but an offset spacer including a stacked film of three or more layers may be formed by further forming a fourth silicon oxide film, a fifth silicon nitride film, or the like.

Modified Example

Hereinafter, a semiconductor device according to a modification and a method of manufacturing the same will be described with reference to FIGS. 17 and 18. In the following description, differences between the modified example and the embodiment will be mainly described.

Figure 17:
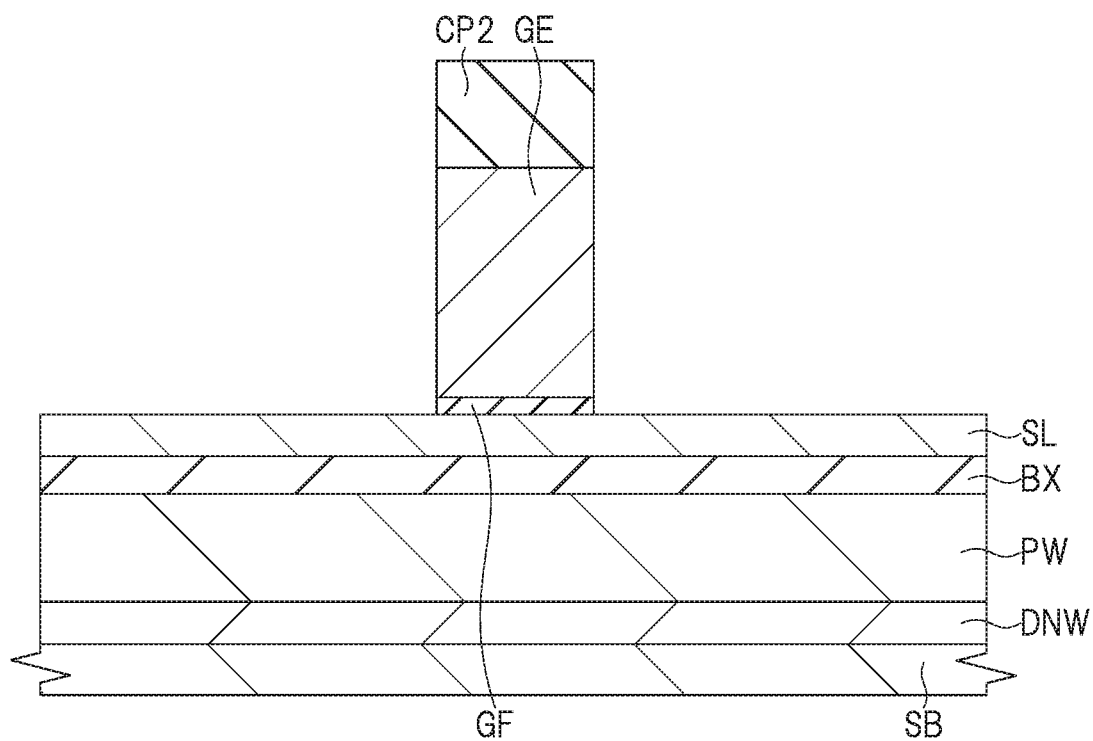
FIG. 17 is a cross-sectional view illustrating a process of manufacturing a semiconductor device according to a Modified Example.

FIG. 17 is a cross-sectional view showing a semiconductor device of a modification during a manufacturing process, and is a cross-sectional view corresponding to FIG. 1 of the embodiment. FIG. 18 shows a cross-sectional view during the manufacturing process subsequent to FIG. 17, and is a cross-sectional view corresponding to FIG. 9 of the embodiment.

As shown in FIG. 17, the cap film CP2 of the modified example is formed thicker than the cap film CP1 of the embodiment, and the thickness of the cap film CP2 is, for example, 50 to 70 nm. Like the cap film CP1, the cap film CP2 is formed on the gate electrode GE by, e.g., CVD, and is made of, e.g., silicon nitride.

Figure 18:
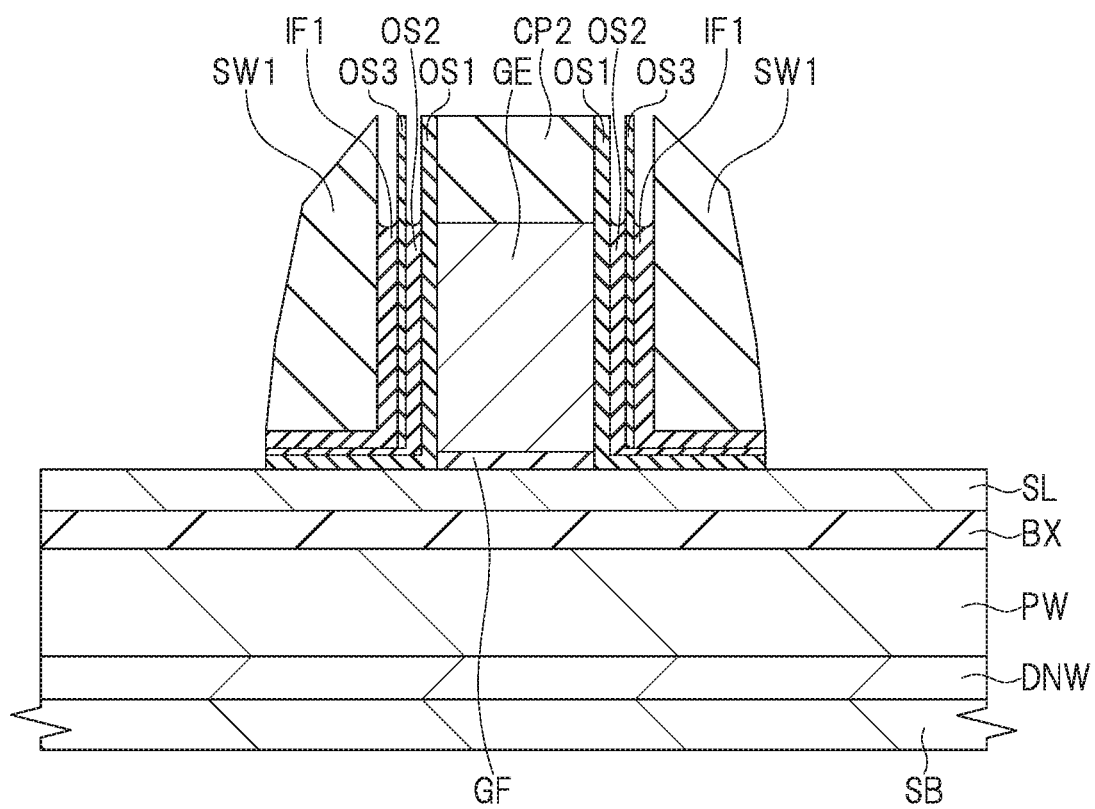
FIG. 18 is a cross-sectional view illustrating a manufacturing process subsequent to FIG. 17.

Therefore, as shown in FIG. 18, since the thickness of the cap film CP2 is increased compared to the embodiment, the heights of the insulating films OS1 to OS3 formed on the side surface of the gate electrode GE and on the side surface of the cap film CP2 are increased, respectively.

That is, in FIG. 18, as in FIG. 9 of the embodiment, wet etching using a solution containing hydrofluoric acid and anisotropic etching are performed, but since the height of the insulating film OS1 in contact with the side surface of the gate electrode GE is high, the side surface of the gate electrode GE is hardly exposed even if the insulating film OS1 recedes.

The height of the insulating film OS2 formed on the side surface of the gate electrode GE through the insulating film OS1 is also high. Therefore, even if the insulating film OS2 recedes and the position of the upper end of the insulating film OS2 becomes lower than the position of the upper end of the insulating film OS1, the position of the upper end of the insulating film OS2 can be kept higher than the upper surface of the gate electrode GE. However, for example, when the etching process is performed for a long time, the position of the upper end of the insulating film OS2 may be lower than the upper surface of the gate electrode GE. Therefore, even if the insulating film OS1 exposed by the recession of the insulating film OS2 is further exposed to the anisotropic etching process and removed, the side surface of the cap film CP2 is exposed, but the side surface of the gate electrode GE is not exposed.

Therefore, in the modification, it is possible to further suppress a problem in which the epitaxial layer EP is formed from the side surface of the gate electrode GE in the next step as compared with the embodiment.

Further, in the step of FIG. 18 of the modification, if the position of the upper end of the insulating film OS1 is higher than the position of the upper surface of the gate electrode GE, the insulating films OS1 and OS3 may be formed of silicon oxide films, and the insulating film OS2 may be formed of silicon nitride films.

Although the invention made by the inventor of the present application has been specifically described based on the above-described embodiment, the present invention is not limited to the above-described embodiment, and various modifications can be made without departing from the gist thereof.

For example, in the above embodiment, the MISFET 1Q is described as an n-type MISFET, but the MISFET 1Q may be a p-type MISFET. That is, the conductivity type of the impurity included in each of the gate electrode GE, the extension region EX, and the diffusion region ND may be p-type, and the conductivity type of the impurity included in the well region PW may be n-type.

The technique disclosed in the above embodiment mode is particularly useful for forming a MISFET 1Q on an SOI substrate, but the technique can also be applied to a case where a MISFET is formed on a bulk substrate (semiconductor substrate SB) of the SOI substrate (semiconductor substrate SB of the semiconductor substrate SB of the semiconductor substrate SB of the semiconductor substrate SB of the semiconductor substrate SB of the present invention).

In the above embodiment, the case where the epitaxial layer EP is a silicon layer is exemplified, but the technique disclosed in the above embodiment can be applied to a semiconductor layer other than the silicon layer, such as a silicon germanium layer or a germanium layer.

In addition, some of the contents described in the above embodiment will be described below.

Additional Statement 1

A method of manufacturing a semiconductor device, comprising the steps of:

(a) forming a gate electrode and a cap film on a first semiconductor layer, the cap film being formed on the gate electrode;

(b) forming a first insulating film comprised of silicon nitride on each of the first semiconductor layer, a side surface of the gate electrode and a side surface of the cap film;

(c) forming a second insulating film comprised of a material, which is different from the first insulating film, on the side surface of the gate electrode via the first insulating film;

(d) forming a third insulating film comprised of a material, which is different from the second insulating film and is a spacer shape, on the side surface of the gate electrode via the first insulating film and the second insulating film;

(e) forming a fourth insulating film comprised of a material, which is different from the first insulating film, on the side surface of the gate electrode via the first insulating film, the second insulating film and the third insulating film, and on the first semiconductor layer via the first insulating film;

(f) forming a fifth insulating film comprised of a material, which is different from the second insulating film, on the side surface of the gate electrode via the first insulating film, the second insulating film, the third insulating film and the fourth insulating film, and on the first semiconductor layer via the first insulating film and the fourth insulating film;

(g) forming a first sidewall spacer by patterning the fifth insulating film;

(h) exposing the first semiconductor layer by removing the fourth insulating film and the first insulating film in sequence, which are exposed from the first sidewall spacer and are formed on the semiconductor layer; and (i) after the step (h), forming a second semiconductor layer on the first semiconductor layer, by epitaxial growth method, in a state that the side surface of the gate electrode and the side surface of the cap film are covered with the first insulating film.

Additional Statement 2

The method according to Additional Statement 1, wherein the first insulating film is in directly contact with the side surface of the gate electrode.

Additional Statement 3

The method according to Additional Statement 2, further comprising the steps of:

(j) after the step (i), removing the first sidewall spacer; and (k) after the step (j), forming a first impurity region in each of the first semiconductor layer and the second semiconductor layer by performing ion implantation with the first insulating film, the second insulating film, the third insulating film and the fourth insulating film, which are formed on the side surface of the gate electrode, as a mask.

Additional Statement 4

A method of manufacturing a semiconductor device, comprising the steps of:

(a) providing a substrate having:
a first semiconductor layer comprised of silicon,
a gate electrode comprised of silicon, and formed on the first semiconductor layer via a gate insulating film, and
a cap film comprised of silicon nitride, and formed on the gate electrode;

(b) forming a first insulating film, which is comprised of silicon nitride, on the first semiconductor layer so as to cover a side surface of the gate electrode;

(c) forming a second insulating film, which is comprised of silicon oxide, on the first insulating film;

(d) a first sidewall spacer, which is comprised of silicon nitride, on the second insulating film;

(e) removing the second insulating film, which is exposed from the first sidewall spacer, by wet etching using a liquid solution including hydrofluoric acid, and exposing a part of the first semiconductor layer;

(f) after the step (e), forming an epitaxial layer on the part of the first semiconductor layer, which is exposed from the first sidewall spacer, by an epitaxial growth method.

Additional Statement 5

The method according to Additional Statement 4, further comprising the step of:

(g) after the step (c) and before the step (d), forming a third insulating film, which is comprised of silicon nitride, on the second insulating film, wherein in the step (d), the first sidewall spacer is formed by patterning the third insulating film into a spacer shape.

Additional Statement 6

The method according to Additional Statement 4, wherein the step (e) is performed in a state that the entire side surface of the gate electrode is covered with the first insulating film.

What is claimed is:

1. A method of manufacturing a semiconductor device, comprising the steps of:

(a) forming a gate electrode and a cap film on a first semiconductor layer, the gate electrode being comprised of a second semiconductor layer, and the cap film being formed on the gate electrode;

(b) forming an offset spacer comprised of a laminated film on each of an upper surface of the first semiconductor layer, a side surface of the gate electrode and a side surface of the cap film, the laminated film being comprised of three or more layers including a first silicon nitride film and a first silicon oxide film;

(c) exposing the upper surface of the first semiconductor layer by removing a part of the offset spacer; and (d) after the step (c), forming a third semiconductor layer on the upper surface of the first semiconductor layer, which is exposed from the offset spacer, by epitaxial growth method, in a state that an upper surface of the gate electrode is covered with the cap film, and that the side surface of the gate electrode is covered with the offset spacer, wherein a film of the laminated film, which is closest to the gate electrode in the laminated film, is the first silicon nitride film, wherein in the step (d), a position of an upper end of the first silicon nitride film formed on the side surface of the gate electrode is higher than a position of the upper surface of the gate electrode, wherein the step (b) comprises the following steps of:

(b1) forming the first silicon nitride film on the upper surface of the first semiconductor layer, the side surface of the gate electrode and the side surface of the cap film;

(b2) forming the first silicon oxide film on the upper surface of the first semiconductor layer, the side surface of the gate electrode and the side surface of the cap film, via the first silicon nitride film;

(b3) forming a second silicon nitride film on each of the upper surface of the first semiconductor layer, the side surface of the gate electrode and the side surface of the cap film, via the first silicon nitride film and the first silicon oxide film; and (b4) forming the second silicon nitride film into a spacer shape such that the first silicon oxide film on the upper surface of the first semiconductor layer is exposed, wherein in the step (c), each of the first silicon oxide film and the first silicon nitride film, that are not covered with the second silicon nitride film, is removed by wet etching using a liquid solution including hydrofluoric acid and also anisotropic etching process, and wherein in the step (d), the position of the upper end of the first silicon nitride film formed on the side surface of the gate electrode is higher than the position of the upper surface of the gate electrode, and a position of an upper end of the first silicon oxide film formed on the side surface of the gate electrode is lower than the position of the upper surface of the gate electrode.

2. The method according to claim 1, wherein the first silicon nitride film is in directly contact with the side surface of the gate electrode.

3. The method according to claim 1, wherein in a direction along a gate length of the gate electrode, the laminated film comprising the offset spacer is formed such that materials of insulating films each comprising the laminated film, which are adjacent to each other, are different from each other.

4. The method according to claim 1, wherein in a direction along a gate length of the gate electrode, the laminated film comprising the offset spacer is formed such that a silicon nitride film included in the laminated film and a silicon oxide film included in the laminated film are alternately arranged.

5. The method according to claim 1, wherein a liquid solution including hydrofluoric acid is used in the step (c), and wherein in the step (d), a position of an upper end of the first silicon oxide film formed on the side surface of the gate electrode is lower than the position of the upper end of the first silicon nitride film formed on the side surface of the gate electrode.

6. The method according to claim 1, further comprising the following step of:

(e) after the step (d), forming a first impurity region in each of the first semiconductor layer and the third semiconductor layer by performing ion implantation, wherein the ion implantation is performed in such a state that a thickness of a part of the offset spacer, which is located on the upper surface of the first semiconductor layer, is thinner than a thickness of a part of the offset space, which is located on the side surface of the gate electrode.

7. The method according to claim 1, wherein the first semiconductor layer is formed on an insulating layer formed on a semiconductor substrate.

8. The method according to claim 7, further comprising the following step of:

(k) after the step (d), forming a plug having a conductive film therein on the third semiconductor layer.

9. The method according to claim 7, wherein each of the first silicon nitride film and the second silicon nitride film is formed by ALD (Atomic Layer Deposition) method.

10. A method of manufacturing a semiconductor device, the method comprising the step of:

(a) forming a gate electrode and a cap film on a first semiconductor layer, the gate electrode being comprised of a second semiconductor layer, and the cap film being formed on the gate electrode;

(b) forming an offset spacer comprised of a laminated film on each of an upper surface of the first semiconductor layer, a side surface of the gate electrode and a side surface of the cap film, the laminated film being comprised of three or more layers including a first silicon nitride film and a first silicon oxide film;

(c) exposing the upper surface of the first semiconductor layer by removing a part of the offset spacer;

(d) after the step (c), forming a third semiconductor layer on the upper surface of the first semiconductor layer, which is exposed from the offset spacer, by epitaxial growth method, in a state that an upper surface of the gate electrode is covered with the cap film, and that the side surface of the gate electrode is covered with the offset spacer; and (e) after the step (d), forming a first impurity region in each of the first semiconductor layer and the third semiconductor layer by performing ion implantation, wherein a film of the laminated film, which is closest to the gate electrode in the laminated film, is the first silicon nitride film, wherein in the step (d), a position of an upper end of the first silicon nitride film formed on the side surface of the gate electrode is higher than a position of the upper surface of the gate electrode, wherein the step (b) comprises the following steps of:

(b1) forming the first silicon nitride film on the upper surface of the first semiconductor layer, the side surface of the gate electrode and the side surface of the cap film;

(b2) forming the first silicon oxide film on the upper surface of the first semiconductor layer, the side surface of the gate electrode and the side surface of the cap film, via the first silicon nitride film;

(b3) forming a second silicon nitride film on each of the upper surface of the first semiconductor layer, the side surface of the gate electrode and the side surface of the cap film, via the first silicon nitride film and the first silicon oxide film; and (b4) forming the second silicon nitride film into a spacer shape such that the first silicon oxide film on the upper surface of the first semiconductor layer is exposed, and wherein the ion implantation is performed by using each of the first silicon nitride film, the first silicon oxide film and the second silicon nitride film, as a mask, and such that an ion passes through each of the first silicon nitride film and the first silicon oxide film, that are formed on the upper surface of the first semiconductor layer.

11. The method according to claim 10, further comprising the following step of:

(f) after the step (b) and the before the step (c), forming a second silicon oxide film on each of the side surface of the gate electrode and the side surface of the cap film via the first silicon nitride film, the first silicon oxide film and the second silicon nitride film, and on the upper surface of the first semiconductor layer via the first silicon nitride film and the first silicon oxide film;

(g) after the step (f) and before the step (c), forming a first sidewall spacer, which is comprised of a third silicon nitride film, on the second silicon oxide film; and (h) after the step (d) and before the step (e), removing the first sidewall spacer and the cap film, wherein in the step (c), each of the second silicon oxide film and the first silicon oxide film, that are not covered with the first sidewall spacer, is removed by wet etching using a liquid solution including hydrofluoric acid, and the first silicon nitride film, that is not covered with the first sidewall spacer, is removed by also anisotropic etching process, and wherein in the step (e), the ion implantation is performed by using each of the first silicon nitride film, the first silicon oxide film, the second silicon nitride film and the second silicon oxide film, as the mask, and such that the ion passes through each of the first silicon nitride film, the first silicon oxide film and the second silicon oxide film, that are formed on the upper surface of the first semiconductor layer.

12. The method according to claim 11, further comprising the following step of:

(i) after the step (e), forming a second sidewall spacer, which is comprised of a fourth silicon nitride film, on each of the second silicon oxide film and the third semiconductor layer; and (j) after the step (i), forming a second impurity region having an impurity concentration higher than an impurity concentration of the first impurity region in each of the first semiconductor layer and the third semiconductor layer by performing ion implantation while using the second sidewall spacer as the mask.

13. The method according to claim 10, wherein the first silicon nitride film is in directly contact with the side surface of the gate electrode.

14. The method according to claim 10, wherein in the step (c), each of the first silicon oxide film and the first silicon nitride film, that are not covered with the second silicon nitride film, is removed by wet etching using a liquid solution including hydrofluoric acid and also anisotropic etching process, and wherein in the step (d), the position of the upper end of the first silicon nitride film formed on the side surface of the gate electrode is higher than the position of the upper surface of the gate electrode, and a position of an upper end of the first silicon oxide film formed on the side surface of the gate electrode is lower than the position of the upper surface of the gate electrode.

15. The method according to claim 10, wherein in the step (c), each of the first silicon oxide film and the first silicon nitride film, that are not covered with the second silicon nitride film, is removed by wet etching using a liquid solution including hydrofluoric acid and also anisotropic etching process, and wherein in the step (d), a position of an upper end of the first silicon oxide film formed on the side surface of the gate electrode is lower than the position of the upper end of the first silicon nitride film formed on the side surface of the gate electrode, and higher than the position of the upper surface of the gate electrode.

16. The method according to claim 10, wherein the first semiconductor layer is formed on an insulating layer formed on a semiconductor substrate.

* * * * *